United States Patent
Roetteler et al.

(10) Patent No.: US 10,423,887 B2
(45) Date of Patent: Sep. 24, 2019

(54) COMPILATION, MEMORY MANAGEMENT, AND FAULT LOCALIZATION WITH ANCILLAS IN AN UNKNOWN STATE

(71) Applicant: Microsoft Technology Licensing, LLC, Redmond, WA (US)

(72) Inventors: Martin Roetteler, Woodinville, WA (US); Krysta Svore, Seattle, WA (US); Thomas Haener, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/640,108

(22) Filed: Jun. 30, 2017

(65) Prior Publication Data

US 2018/0144262 A1 May 24, 2018

Related U.S. Application Data

(60) Provisional application No. 62/425,964, filed on Nov. 23, 2016.

(51) Int. Cl.
| | |
|---|---|
| *G06F 7/00* | (2006.01) |
| *G06N 10/00* | (2019.01) |
| *G06F 17/10* | (2006.01) |
| *B82Y 10/00* | (2011.01) |
| *H03M 13/29* | (2006.01) |
| *H03K 19/20* | (2006.01) |

(52) U.S. Cl.
CPC .............. *G06N 10/00* (2019.01); *B82Y 10/00* (2013.01); *G06F 17/10* (2013.01); *H03K 19/20* (2013.01); *H03M 13/29* (2013.01)

(58) Field of Classification Search
None
See application file for complete search history.

(56) References Cited

U.S. PATENT DOCUMENTS

| | | | | |
|---|---|---|---|---|
| 7,447,719 | B2 * | 11/2008 | Goto ...................... | B82Y 10/00 708/191 |
| 2005/0059167 | A1 * | 3/2005 | Vitaliano ............... | B82Y 10/00 436/518 |
| 2007/0288684 | A1 * | 12/2007 | Bergou .................. | B82Y 10/00 711/101 |

(Continued)

OTHER PUBLICATIONS

Amy et al., "Verified Compilation of Space-Efficient Reversible Circuits," Arxiv.org, pp. 1-24 (Mar. 2016).

(Continued)

*Primary Examiner* — David H Malzahn
(74) *Attorney, Agent, or Firm* — Klarquist Sparkman, LLP

(57) ABSTRACT

Among the embodiments disclosed herein are quantum circuits (and associated compilation techniques) for performing Shor's quantum algorithm to factor n-bit integers. Example embodiments of the circuits use only 2n+2 qubits. In contrast to previous space-optimized implementations, embodiments of the disclosed technology feature a purely Toffoli-based modular multiplication circuit. Certain other example modular multiplication circuits disclosed herein are based on an (in-place) constant-adder that uses dirty ancilla qubits to achieve a size in $\mathcal{O}$ (n log n) and a depth in $\mathcal{O}$ (n).

15 Claims, 30 Drawing Sheets

(56) References Cited

U.S. PATENT DOCUMENTS

| | | | | |
|---|---|---|---|---|
| 2011/0047201 A1* | 2/2011 | Macready | ............... | B82Y 10/00 |
| | | | | 708/446 |
| 2013/0246495 A1* | 9/2013 | Svore | .................... | B82Y 10/00 |
| | | | | 708/491 |
| 2018/0144262 A1* | 5/2018 | Roetteler | ............. | G06N 99/002 |
| 2018/0336015 A1* | 11/2018 | Roetteler | ................ | G06F 7/721 |

OTHER PUBLICATIONS

Barenco et al., "Approximate Quantum Fourier Transform and Decoherence," *Physical Review A*, vol. 54, 22 pp. (Jan. 1996).

Barenco et al., "Elementary gates for quantum computation," *Physical Review A*, vol. 52, 31 pp. (Mar. 1995).

Beauregard, "Circuit for Shor's Algorithm Using 2n + 3 qubits," *Quantum Information & Compuation*, vol. 3, pp. 175-185 (2003).

Bocharov et al., "Efficient synthesis of probabilistic quantum circuits with fallback," *Physical Review A*, vol. 91, 17 pp. (2015).

Chi et al., "Function-dependent Phase Transform in Quantum Computing," Arxiv.org, pp. 1-5 (Jun. 2000).

Cleve et al., "Fast parallel circuits for the quantum fourier transform," *Foundations of Computer Science*, pp. 523-536 (2000).

Cuccaro et al., "A new quantum ripple-carry addition circuit," arXiv:quant-ph/0410184, 9 pp. (Oct. 2004).

Draper, "Addition on a Quantum Computer," arXiv:quant-ph/0008033, 8 pp. (Aug. 2000).

Gidney, "Creating bigger controlled nots from single qubit, Toffoli and CNOT gates, without workspace," *Computer Science StackExchange*, 4 pp. (Jul. 2015).

Griffiths et al., "Semiclassical Fourier Transform for Quantum Computation," *Physical Review Letters*, vol. 76, pp. 3228-3231 (1996).

Häner et al., "Factoring Using 2n+2 qubits with Toffoli based modular multiplication," arxiv.org/pdf/1611.07955.pdf, pp. 1-12 (Jun. 2017).

Häner et al., "High Performance Emulation of Quantum Circuits," *Int'l Conf. for High Performance Computing, Networking, Storage and Analysis*, 9 pp. (Apr. 2016).

International Search Report and Written Opinion dated Mar. 8, 2018, from International Patent Application No. PCT/US2017/062118, 21 pp.

Jones, "Novel constructions for the fault-tolerant Toffoli gate," *Physical Review A*, vol. 87, 5 pp. (2013).

Kliuchnikov et al., "Practical approximation of single-qubit unitaries by single-qubit quantum clifford and T circuits," *IEEE Trans. on Computers*, vol. 65, pp. 161-172 (Jan. 2016).

Kutin, "Shor's Algorithm on a Nearest-Neighbor Machine," arXiv:quant-ph/0609001, 11 pp. (Aug. 2006).

Ross et al., "Optical ancilla-free Clifford+T approximation of z-rotations," arXiv:1403.2975v1, 36 pp. (Mar. 2014).

Shor, "Algorithms for Quantum Computation: Discrete Logarithms and Factoring," *Foundations of Computer Science*, pp. 124-134 (1994).

Smelyanskiy et al., "qHiPSTER: The Quantum High Performance Software Testing Environment," arXiv:1601.07195, 9 pp. (May 2016).

Takahashi et al., "Quantum addition circuits and unbounded fan-out," ArXiv:0910.2530, 17 pp. (Oct. 2009).

Takahashi, "Quantum Arithmetic Circuits: A Survey," *IEICE Trans. on Fundamentals of Electronics, Communications, and Computer Sciences*, vol. E92A, No. 5, pp. 1276-1283 (May 2009).

Takahashi et al., "Shallow Quantum Circuits with Uninitialized Ancillary Qubits," Arxiv.org, pp. 1-24 (Aug. 2016).

Van Meter et al., "Fast Quantum Modular Exponentiation," *Physical Review A*, vol. 71, 12 pp. (2005).

Wecker et al., "LIQUi|>: A Software Design Architecture and Domain-Specific Language for Quantum Computing," arXiv:1402.4467, 14 pp. (Feb. 2014).

\* cited by examiner

Example fault localization by binary search method

US 10,423,887 B2

COMPILATION, MEMORY MANAGEMENT, AND FAULT LOCALIZATION WITH ANCILLAS IN AN UNKNOWN STATE

CROSS-REFERENCE TO RELATED APPLICATIONS

This application claims the benefit of U.S. Provisional Application No. 62/425,964, entitled "COMPILATION, MEMORY MANAGEMENT, AND FAULT LOCALIZATION WITH ANCILLAS IN AN UNKNOWN STATE" and filed on Nov. 23, 2016, which is hereby incorporated herein by reference in its entirety.

FIELD

This application relates to methods and circuits for operating quantum computing devices.

BACKGROUND

Certain approaches for implementing basic arithmetic in quantum devices, such as additions—and building on this then the entire stack of modular additions, multiplications, and exponentiations used to implement Shor's algorithm—assume that ancillas (ancilla qubits) are available that are in a known state. In quantum computing, ancillas in a known state are often called "clean qubits", but it is usually quite difficult to add new, clean qubits to a system. It is therefore preferable to work with ancillas (ancilla qubits) that are in an unknown state but which are currently not used elsewhere in the quantum computer. Such qubits in an unknown state are referred to herein as "dirty ancillas" to distinguish them from clean ancillas. Typically, there is an abundance of available dirty ancillas at any point during a quantum computation. However, making use of them in a meaningful way was previously not known.

SUMMARY

Among the embodiments disclosed herein are quantum circuits (and associated compilation techniques) for performing Shor's quantum algorithm to factor n-bit integers. Example embodiments of the circuits use only 2n+2 qubits. In contrast to previous space-optimized implementations, embodiments of the disclosed technology feature a purely Toffoli-based modular multiplication circuit. The circuit depth and the overall gate count are in $\mathcal{O}$ ($n^3$) and $\mathcal{O}$ ($n^3$ log n), respectively. Thus, desirable space and time costs can be achieved while using a purely classical modular multiplication circuit. This enables testing and localization of faults in both, the logical level circuit and an actual quantum hardware implementation. Also, embodiments of the disclosed approach evade most of the cost overheads originating from rotation synthesis. For instance, certain example modular multiplication circuits disclosed herein are based on an (in-place) constant-adder that uses dirty ancilla qubits to achieve a size in $\mathcal{O}$ (n log n) and a depth in $\mathcal{O}$ (n).

Embodiments of the disclosed technology also include techniques for implementing a quantum circuit for integer addition of a general number by a constant number that can be implemented if n/2 dirty ancilla qubits are available. Such embodiments provide improvements over alternative approaches that achieve this result either with a large number of ancillas (namely, n many, and they were assumed to be clean) or with a type of elementary gate that is difficult to implement fault-tolerantly, namely, rotation gates around very small angles. Further, certain embodiments use so-called Toffoli gates without resort to more complex quantum gates. In general, Toffoli gates are easier to implement fault-tolerantly. In particular implementations, a circuit for performing Shor's algorithm can constructed using the disclosed technology using only 2n+2 qubits to factor an n-bit number. Such implementations can comprise, for example, $\mathcal{O}$ ($n^3$ log n) Toffoli gates.

More generally, embodiments of the disclosed technology address the problem of implementing arithmetic operations on a quantum computer. This is a desirable component for many quantum algorithms, for instance for Shor's algorithm for factoring integers. In Shor's algorithm, modular exponentiation is used, which itself is implemented using several modular multiplications, which in turn are implemented using several modular additions, which in further turn are implemented using integer additions. Embodiments of the disclosed technology not only are configured to perform such arithmetic but can do so using additional memory as scratch space where that additional memory can be in an unknown (or dirty) state. An additional benefit of embodiments of the disclosed technology is that it is testable, as the circuits are based on Toffoli gates, which means that logical level testing on test vectors can be done for the logical level circuits. Moreover, in a hardware implementation, circuits implemented in quantum computers in accordance with the disclosed technology can be debugged and faults in the hardware implementation can be localized. This is in contrast to other methods for implementing quantum arithmetic.

The example circuits and methods disclosed herein are not limited to Shor's algorithm, but can be employed in a wide variety of other contexts as well. For example, the disclosed circuits and methods can be used to implement a wide variety of other algorithms, including but not restricted to numerical computations, such as Newton's method or polynomial and rational function evaluation.

Embodiments of the disclosed technology do not require the presence of clean ancillas, which is a significant advantage, as clean ancillas are difficult to prepare and lead to an increase of the memory size required to implement the quantum computation. Instead, certain embodiments of the disclosed technology use so-called "dirty" ancillas, which are qubits in an unknown state that are otherwise sitting idle in the quantum computer's memory and which can be restored after the computation.

The disclosed circuits can be generated using any suitable synthesis/compilation method for quantum circuit designs. For instance, the described circuits can be synthesized/compiled in a quantum circuit synthesizer/compiler that produces a resulting quantum circuit. The resulting quantum circuit can then be implemented in a quantum computing device (e.g., controlled by one or more quantum computer controllers), which may itself be interfaced and/or controlled by a classical computing system. The various innovations can be used in combination or separately.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

BRIEF DESCRIPTION OF THE DRAWINGS

FIG. 13 shows the request for memory allocation stage.

FIG. 14 shows an example memory allocation and heap updating stage.

FIG. 15 shows an example memory deallocation stage.

FIG. 16 shows an example memory deallocation and heap updating stage.

FIG. 19 shows a complete Toffoli network T that is tested in the root note of the binary search and the subcircuit $T_0$ comprising the first half of gates in T.

FIG. 20 shows a complete Toffoli network T that is tested in the root note of the binary search and the subcircuit $T_1$ comprising the second half of gates in T.

DETAILED DESCRIPTION

I. General Considerations

Figure 1:
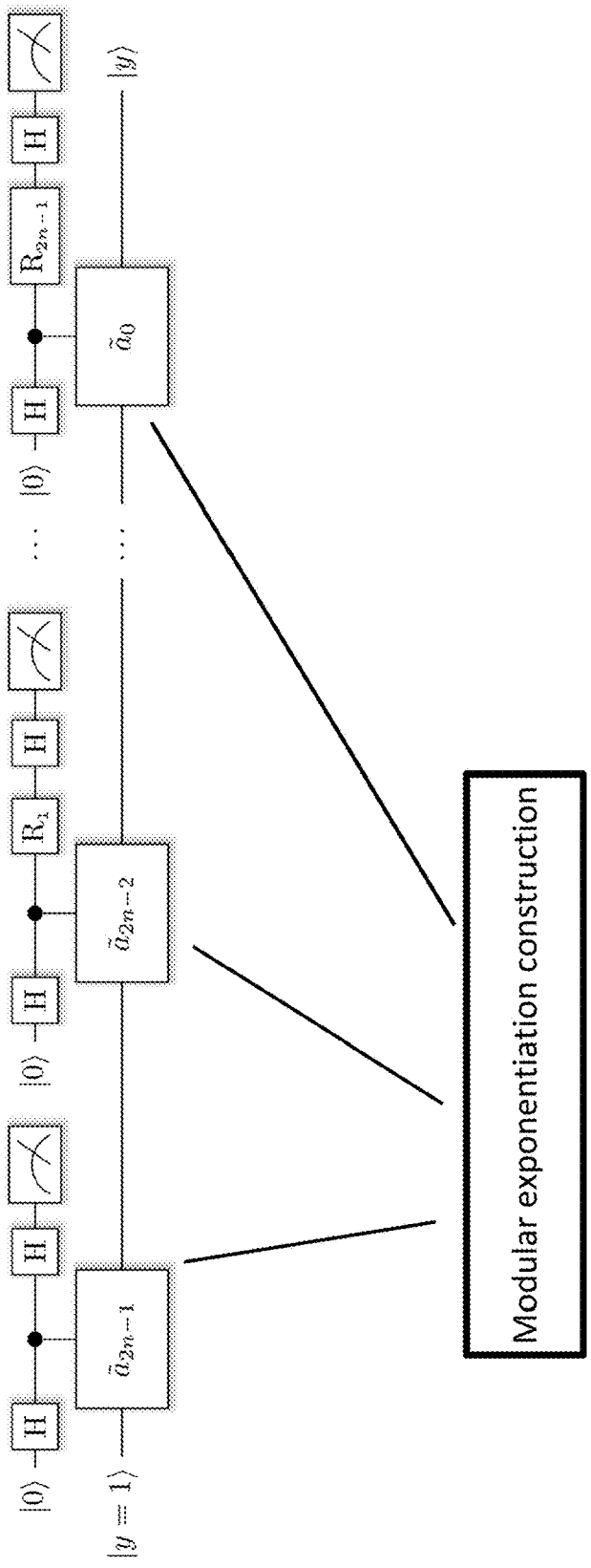
FIG. 1 is a schematic diagram illustrating an example implementation of Shor's quantum algorithm for factoring of integers that uses 2n+2 qubits and is based on modular exponentiation circuits.

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

A. Introduction

Quantum computers offer an exponential speedup over their classical counterparts for solving certain problems, including Shor's algorithm (see, e.g., Peter W. Shor, "Algorithms for quantum computation: Discrete logarithms and factoring," in Foundations of Computer Science, 1994 Proceedings., 35th Annual Symposium, pages 124-134 (IEEE, 1994)) for factoring a large number N—an algorithm that enables the breaking of many popular encryption schemes including RSA. At the core of Shor's algorithm lies a modular exponentiation of a constant a by a superposition of values x stored in a register of 2n quantum bits (qubits), where $n = \lceil \log_2 N \rceil$. Denoting the x-register by $|x\rangle$ and adding a result register initialized to $|0\rangle$, this can be written as $$|x\rangle |0\rangle \mapsto |x\rangle |a^x \bmod N\rangle.$$

This mapping can be implemented using 2n modular multiplications, each of which can be replaced by n modular additions using repeated-addition-and-shift. See, e.g., Stephane Beauregard, "Circuit for Shor's algorithm using 2n+3 qubits," Quantum Information and Computation, 3(2): 175-185 (2003). For an illustration of an example circuit, see circuit 100 in FIG. 1.

There are many possible implementations of Shor's algorithm, all of which offer deeper insight into space/time trade-offs by, e.g., using different ways of implementing the circuit for adding a known classical constant c to a quantum register $|a\rangle$ (see Table I). The implementation given in Yasuhiro Takahashi and Noboru Kunihiro, "A quantum circuit for Shor's factoring algorithm using 2n+2 qubits," Quantum Information and Computation, 6(2):184-192 (2006) features the lowest known number of qubits and uses Draper's addition in Fourier space (see, e.g., Thomas G Draper, "Addition on a quantum computer," arXiv preprint quant-ph/0008033 (2000)), allowing factoring to be achieved using only 2n+2 qubits at the cost of a circuit size in $\Theta(n^3 \log n)$ or even $\Theta(n^4)$ when using exact quantum Fourier transforms (QFT). Furthermore, the QFT circuit features many (controlled) rotations, which in turn imply a large T-gate count when quantum error-correction (QEC) is required. Implementations using classically-inspired adders, on the other hand, yield circuits with as few as $3n+\mathcal{O}(1)$ qubits and $\mathcal{O}(n^3)$ size. Such classical reversible circuits have several advantages over Fourier-based arithmetic. In particular, 1. they can be efficiently simulated on a classical computer, e.g., the logical circuits can be tested on a classical computer,
2. they can be efficiently debugged when the logical level circuit is implemented in actual quantum hardware implementation, and
3. they do not suffer from the overhead of single-qubit rotation synthesis when employing QEC.

FIG. 1 shows an example circuit 100 for Shor's algorithm using a single-qubit semi-classical quantum Fourier transform. In total, 2n modular multiplications by $\tilde{a}_i = a^{2^i} \bmod N$ are required (denoted by $\tilde{a}_i$-gates in the circuit). The phase-shift gates $R_k$ are given by $$\begin{pmatrix} 1 & 0 \\ 0 & e^{i\theta_k} \end{pmatrix} \text{ with } \theta_k = -\sum_{j=0}^{k-1} 2^{k-j} m_j,$$

where the sum runs over all previous measurements j and $m_j \in \{0, 1\}$ denotes the respective measurement result ($m_0$ denotes the least significant bit of the final answer and is obtained in the first measurement).

The reversible circuit descriptions for arithmetic can be based on a plurality of target reversible circuit gate sets such as specified by the reversible circuit description in a physical embodiment of

TABLE I

Costs associated with various implementations of addition $|a\rangle \mapsto |a + c\rangle$ of a value a by a classical constant c. See Steven A Cuccaro, Thomas G Draper, Samuel A Kutin, and David Petrie Moulton, "A new quantum ripple-carry addition circuit," arXiv preprint quant-ph/0410184 (2004); Thomas G Draper, "Addition on a quantum computer," arXiv preprint quant-ph/0008033 (2000); Yasuhiro Takahashi, Seiichiro Tani, and Noboru Kunihiro, "Quantum addition circuits andunbounded fan-out," arXiv preprint arXiv: 0910.2530 (2009).

Figure 11:
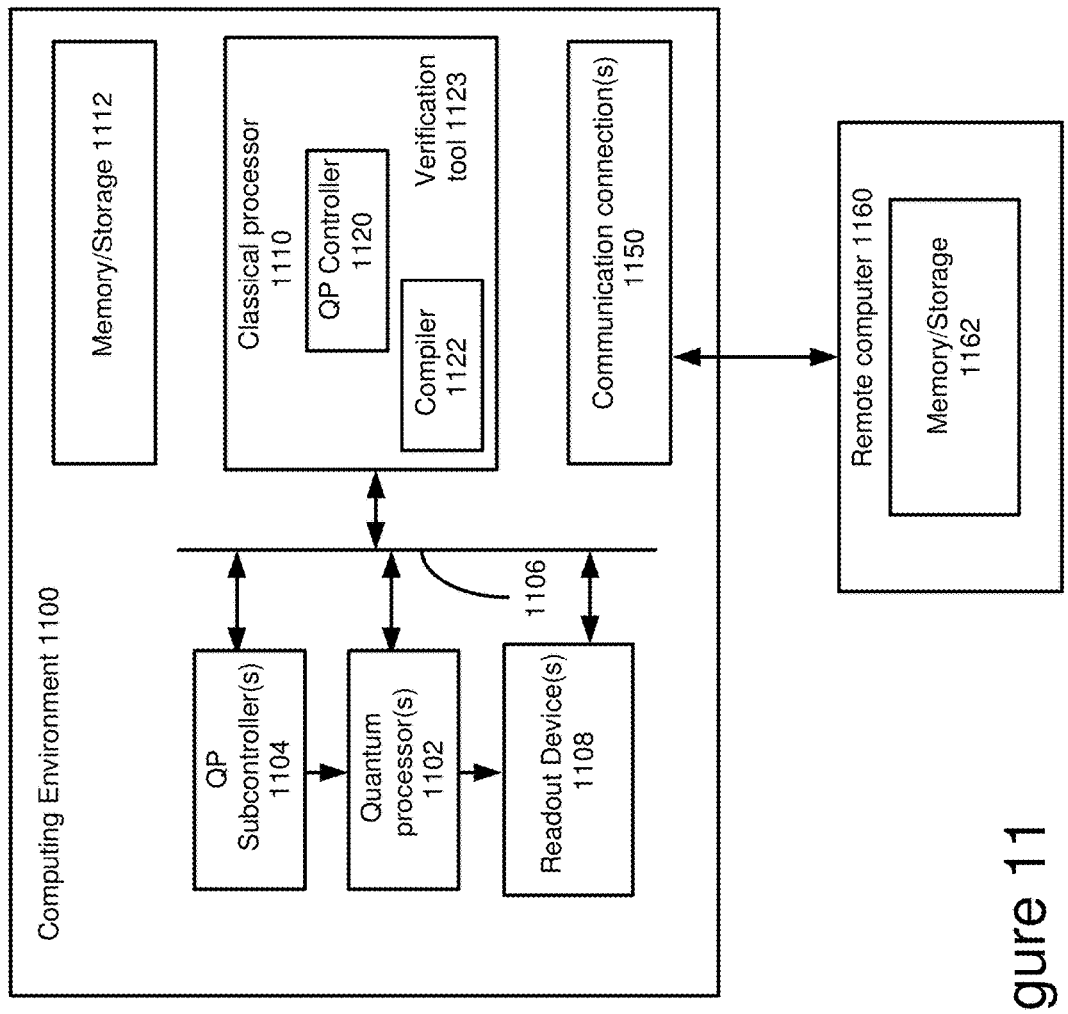
FIG. 11 shows an example quantum computing system in which aspects of the disclosed technology can be implemented.

|  | Cuccaro | Takahashi | Draper | Disclosed adder |
| --- | --- | --- | --- | --- |
| Size | $\Theta(n)$ | $\Theta(n)$ | $\Theta(n^2)$ | $\Theta(n \log n)$ |
| Depth | $\Theta(n)$ | $\Theta(n)$ | $\Theta(n)$ | $\Theta(n)$ |
| Ancillas | n + 1 (clean) | n (clean) | 0 | 1 (dirty) | a reversible circuit architecture (e.g., a quantum computer). Such a quantum computing device can be configured to operate according to one of a variety of quantum computing principles. For instance, the quantum computer can be one or more of: (a) a superconducting quantum computer in which the qubits are stored in the energy levels of a superconductor and in which qubits are manipulated by applying external electromagnetic fields, thereby allowing implementation of the quantum computer circuit description by a universal gate set implemented by the superconducting quantum computer system; (b) an ion trap quantum computer in which the qubits are stored in the internal energy levels of trapped ions and in which qubits are manipulated by applying laser pulses, thereby allowing implementation of the quantum computer circuit description by a universal gate set implemented by the ion trap quantum computer system; (c) a fault-tolerant architecture for quantum computing in which qubits are encoded using quantum error-correcting codes, or using a hierarchy of quantum error-correcting codes, and in which qubits are manipulated by means of encoded operations, thereby allowing implementation of the quantum computer circuit description as encoded operations over a universal fault-tolerant gate set;

or (d) a topological quantum computer (e.g., a topological quantum computing device using Majorana zero modes). An example arrangement for controlling a quantum computer using the compiled/synthesized quantum circuit description is shown in FIG. 11. It should be noted that, in some cases, some additional processing is performed to prepare the quantum circuit description for use with the quantum computer (e.g., translation into the magnetic fields, pulses, encoded operations, or other such control signals adapted for the particular target quantum circuit).

In certain embodiments of the reversible circuit architecture, the elementary operations are Toffoli gates, where a Toffoli gate is the operation that maps $(x, y, z) \mapsto (x, y, z \oplus xy)$, where $\oplus$ denotes the XOR-operation and $xy$ denotes the AND-operation of boolean values. It is known that the Toffoli gate is unversal for reversible computation. Also, it is known that the Toffoli gate has circuit implementations over universal gate sets for quantum computation. See, e.g., Adriano Barenco, Charles H Bennett, Richard Cleve, David P DiVincenzo, Norman Margolus, Peter Shor, Tycho Sleator, John A Smolin, and Harald Weinfurter, "Elementary gates for quantum computation," Physical review A, 52(5):3457, 1995; N. Cody Jones, "Novel constructions for the fault-tolerant Toffoli gate," Physical Review A, 87:022328 (2013). Reference is made to the gate set comprising all possible Toffoli gates between all possible qubits, together with the CNOT gate $(x, y) \mapsto (x, x \oplus y)$ and the NOT gate $x \mapsto x \oplus 1$, as the Toffoli gate set. In other embodiments, the reversible circuit architecture can be based on Fredkin gates, multiply-controlled NOT gates, and other universal reversible gates.

In particular embodiments of the disclosed technology, a $\mathcal{O}$ ($n^3 \log n$)-sized implementation of Shor's algorithm is constructed from a Toffoli-based in-place constant-adder, which adds a classically known n-bit constant c to the n-qubit quantum register $|a\rangle$, e.g., which implements $|a\rangle |0\rangle \mapsto |a+c\rangle$ where a is an arbitrary n-bit input and a+c is an n+1-bit output.

One of the technical innovations achieved with embodiments of the disclosed technology is to obtain space savings by making use of dirty ancilla qubits, which the circuit is allowed to borrow during its execution. By a dirty ancilla, what is meant is—in contrast to a clean ancilla which is a qubit that is initialized in a known quantum state—a qubit which can be in an arbitrary state and, in particular, may be entangled with other qubits. In example circuits disclosed herein, whenever such dirty ancilla qubits are borrowed and used as scratch space, they are then returned in exactly the same state as they were in when they were borrowed.

Figure 12:
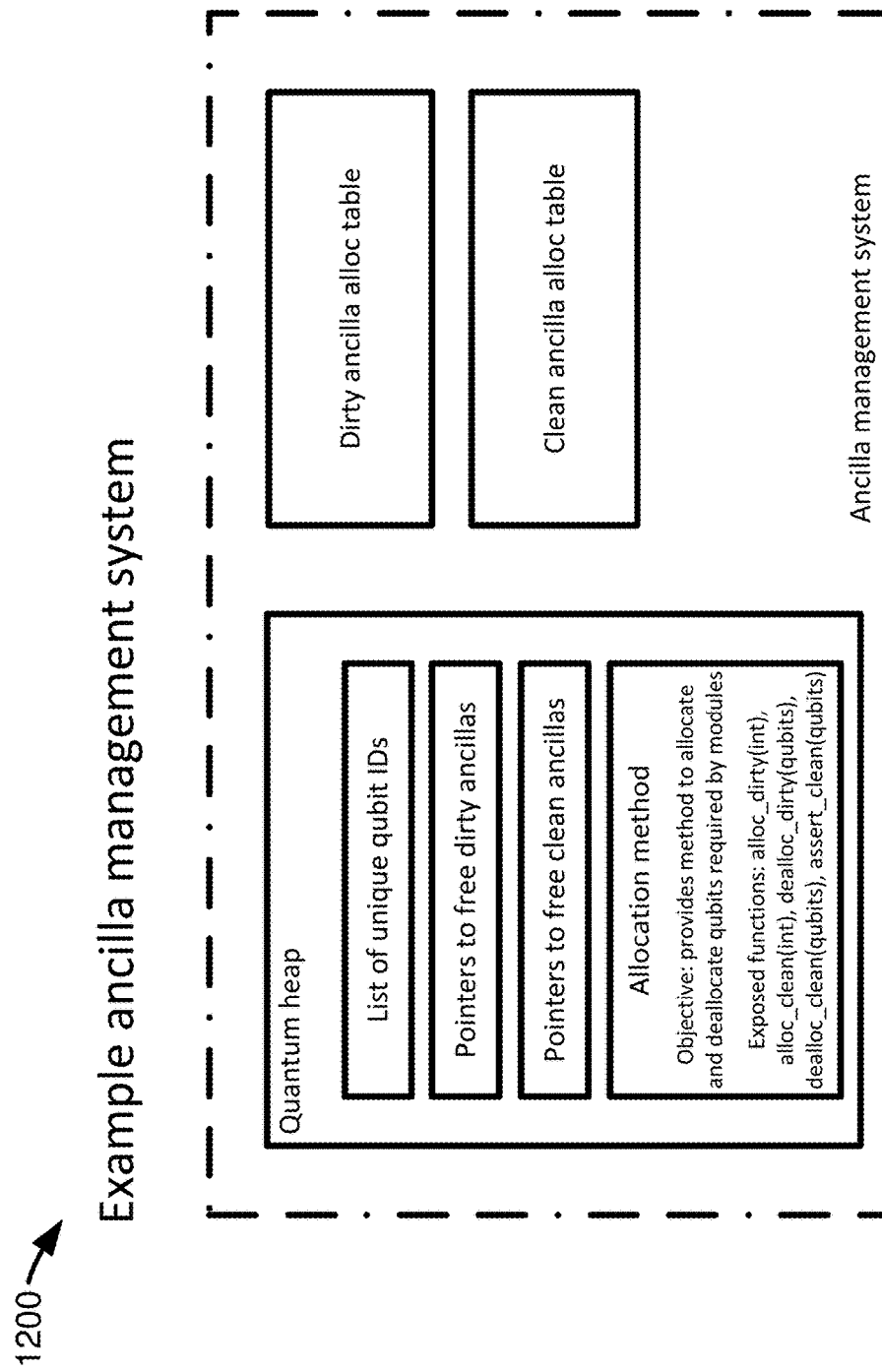
FIG. 12 is a schematic diagram showing example components of an ancilla management system that is used to managed ancilla qubit resources for the compilation of quantum circuit modules.

Allocation and de-allocation of dirty ancillas can be handled by an ancilla management system, an example of which is shown in schematic block diagram 1200 of FIG. 12. This system allows one to allocate a plurality of dirty ancilla qubits or—if needed—a plurality of clean ancilla qubits from a quantum heap structure. This structure provides basic instructions for allocation and deallocation of quantum memory, where the deallocation of clean ancillas is handled using assertions that are provided in the source code implementations of the underlying modules, wherein said assertions ascertain that the clean ancillas that have been used as intermediate scratch space for computations are indeed returned clean after the module is completed. For dirty ancillas such assertions are not needed.

The ancilla management system can implement a variety of allocation methods. For example, the ancilla management system can perform a function alloc_dirty (n), where n is a natural number, which allocates n dirty ancillas to a requesting process and returns a failure response if this allocation is impossible. One possible embodiment of such a allocation function can be realized by keeping track of a pointer table that remembers all free qubits that are not being currently used for the compilation of any other module. The methods provided by the ancilla management system can also include a function alloc_clean(n) which allocates n qubits that are in a known state and returns failure if this allocation is impossible. Again, the plurality of free, clean ancillas can be tracked by a pointer table.

Returning of ancillas can be handled by methods dealloc_dirty(qs) and dealloc_clean(qs) where qs is a list of unique qubit identifiers. In the case of clean qubits, the deallocation generally is a non-trivial problem as it involves ascertaining that a specific qubit, or a specific collection of qubits, are unentangled with the rest of the quantum memory. In some cases this can be asserted by computing a partial trace and confirming that the resulting state is a product state. In some other cases this can be asserted from the structure in which the requesting module handles the ancillas, e.g., by explicitly uncomputing all operations that might have led to the qubit being in a dirty state. The function assert_clean(qs) asserts that a collection qs of qubits is indeed in a clean state.

Figure 13:
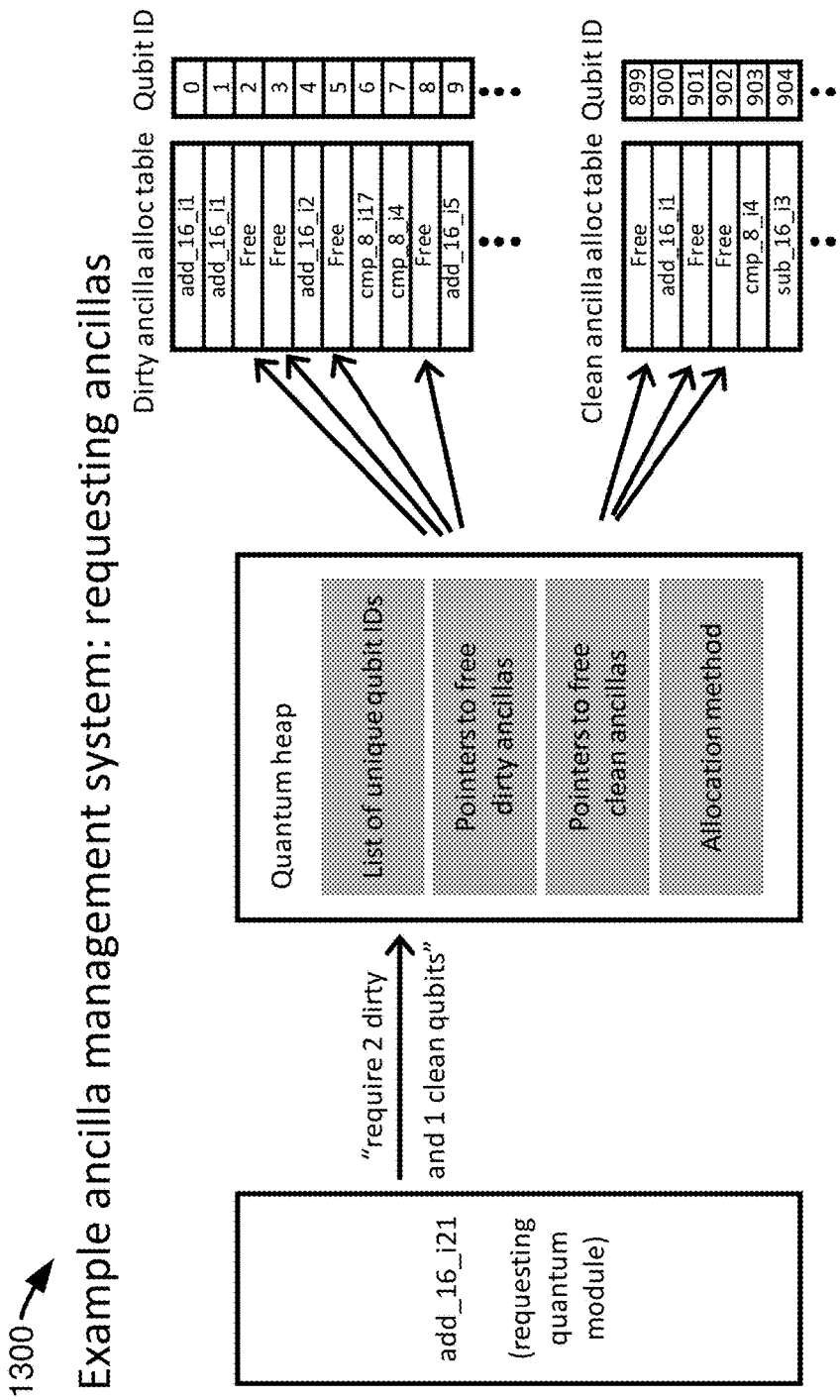
FIG. 13 is a schematic diagram showing an example interaction between the compiler and the ancilla management system, using the example of a 16-bit adder.
Figure 14:
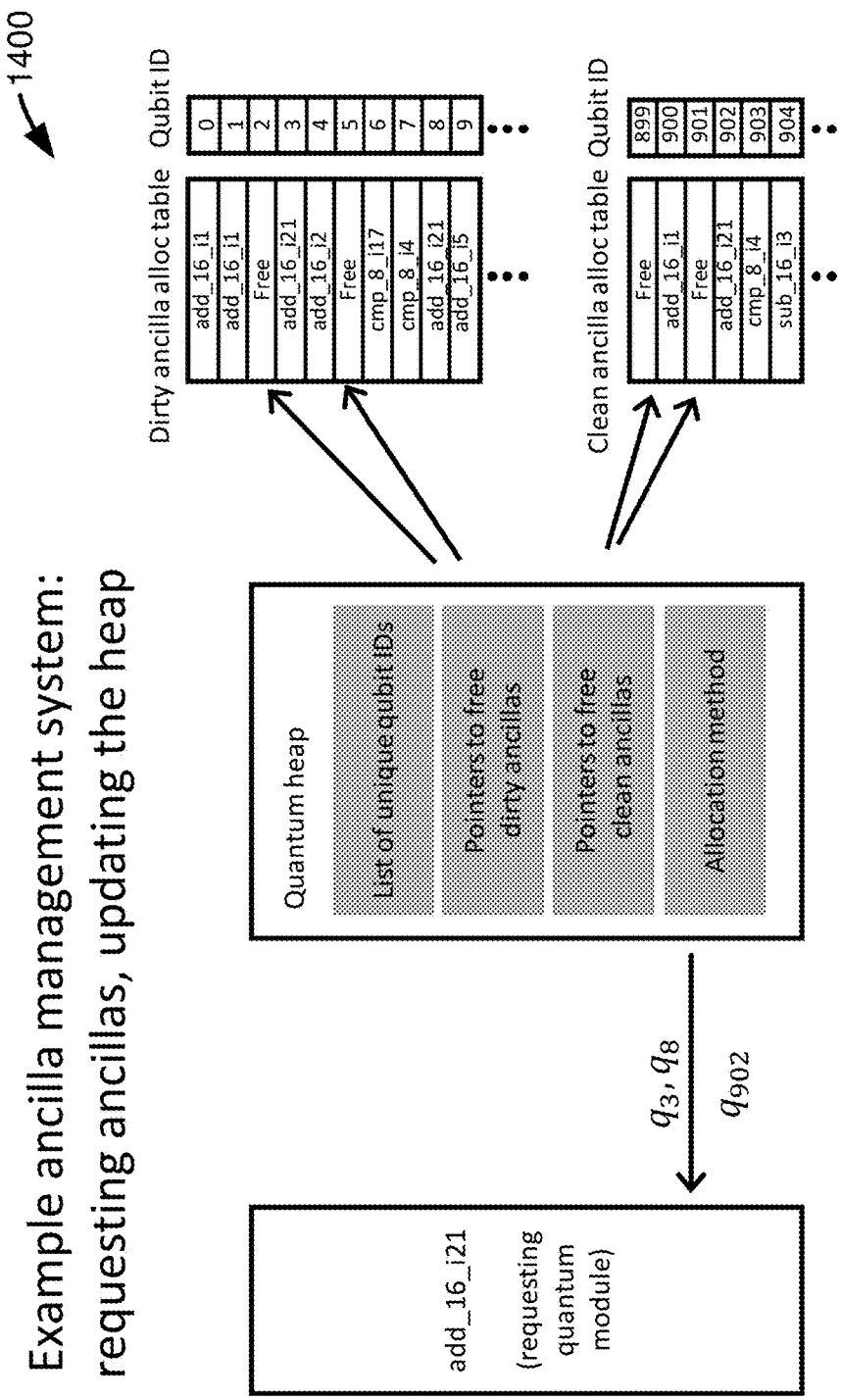
FIG. 14 is a schematic diagram showing an example interaction between the compiler and the ancilla management system, using the example of a 16-bit adder.

FIG. 13 is a schematic block diagram 1300 showing an example interaction of a compiler system that tries to synthesize a reversible network for a 16-bit adder with name add_16_i21, indicating that the bit size of the adder is 16 bit and that the adder has a label 21, indicating that there might be several adders that need to be synthesized by the compiler, possibly to be applied concurrently. The compiler requests a number of dirty and clean ancillas from the quantum heap data structure. The quantum heap then consults the lists of pointers of free dirty and clean ancillas. If there is enough ancilla qubits available to accommodate the request, the unique identifiers of said qubits are returned, as shown in schematic block diagram 1400 of FIG. 14, otherwise an error message is returned.

Figure 15:
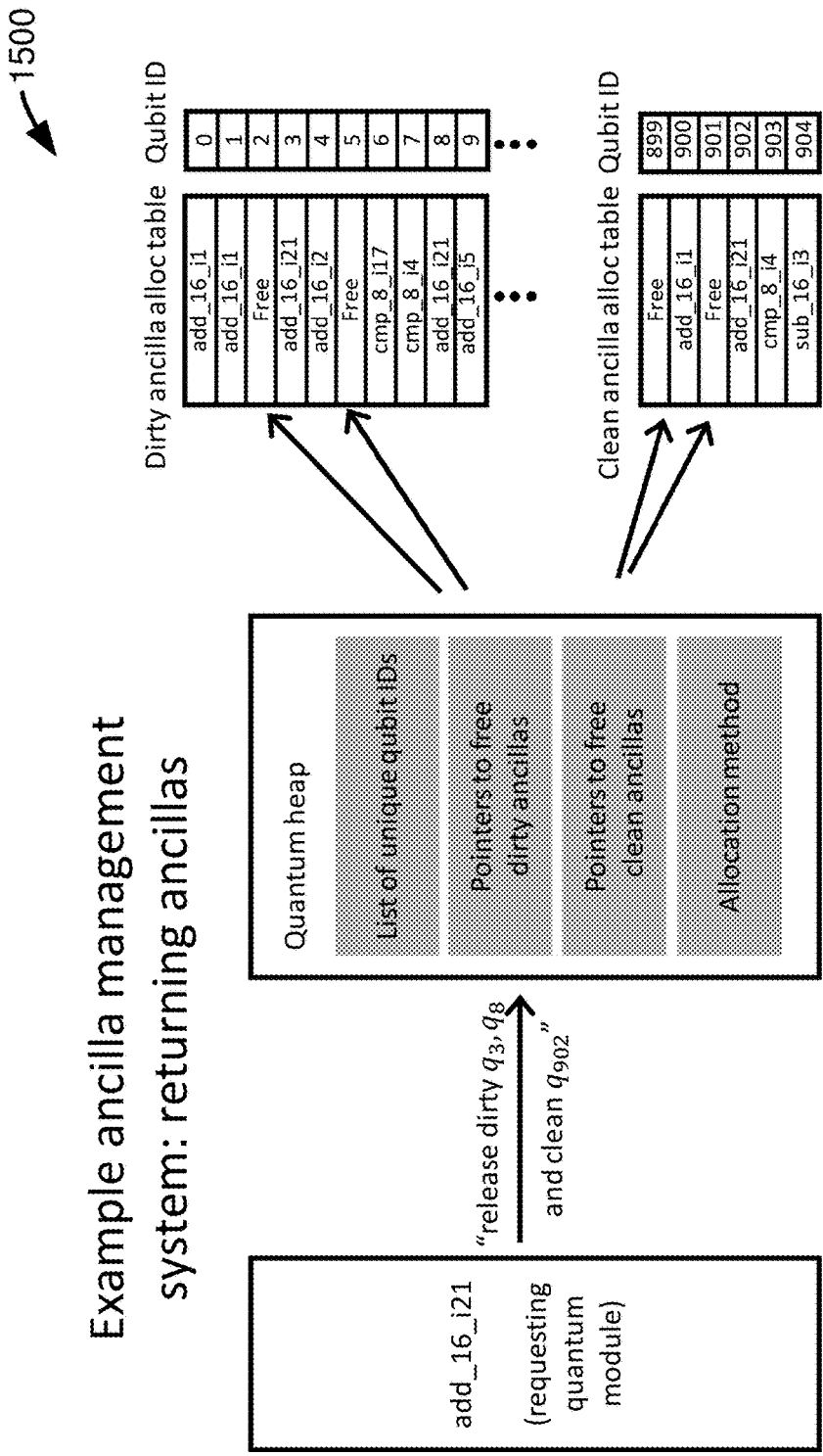
FIG. 15 is a schematic diagram showing an example interaction between the compiler and the ancilla management system, using the example of a 16-bit adder.
Figure 16:
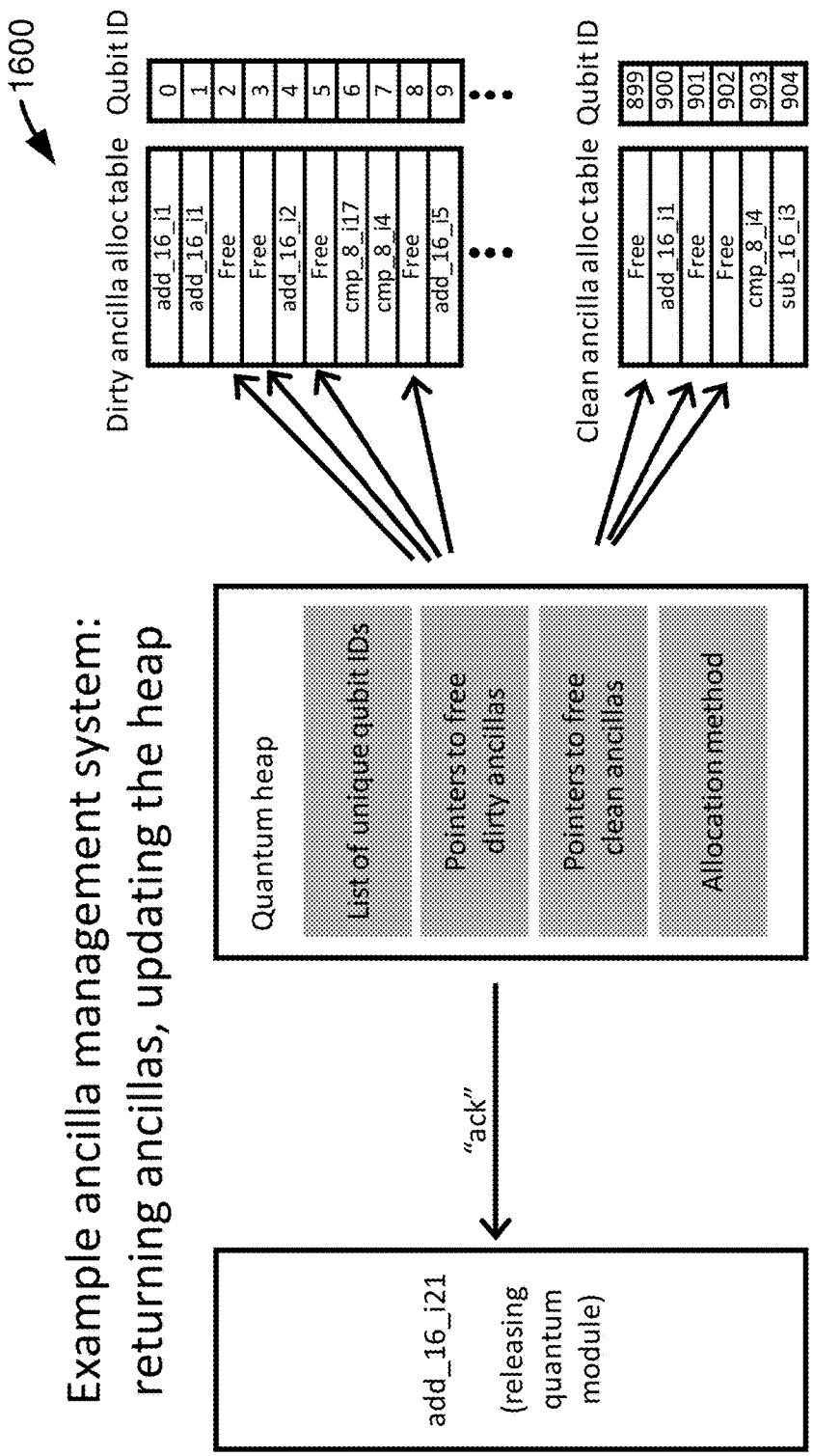
FIG. 16 is a schematic diagram showing an example interaction between the compiler and the ancilla management system, using the example of a 16-bit adder.

After the module has been successfully synthesized, the qubits are deallocated, e.g., they are released back onto the quantum heap so that they might be re-used for the synthesis of other modules by the compiler system. The deallocation is shown in schematic block diagram 1500 of FIG. 15 and the update step of the lists of pointers is shown in schematic block diagram 1600 of FIG. 16.

An example embodiment of an addition circuit disclosed herein use $\mathcal{O}$ (n log n) Toffoli gates and has an overall depth depth of O(n) when using $$\frac{n}{2}$$

dirty ancillas and $\mathcal{O}$ (n log n) when using 1 dirty ancilla. Following Beauregard (see Stephane Beauregard, "Circuit for Shor's algorithm using 2n+3 qubits," Quantum Information and Computation, 3(2):175-185 (2003), an example modular multiplication circuit can be constructed using this adder. The gate counts of Shor's algorithm can then be counted in order to compare example implementations in accordance with the disclosed technology to the one of Yasuhiro Takahashi and Noboru Kunihiro, "A quantum circuit for Shor's factoring algorithm using 2n+2 qubits," Quantum Information and Computation, 6(2):184-192 (2006), who used Fourier addition as a basic building block.

In Section II below, examples of a Toffoli-based in-place addition circuit are described, including parallelization. Example implementation details of the modular addition and the controlled modular multiplier are then discussed in Section IV, where the same constructions as in Yasuhiro Takahashi and Noboru Kunihiro, "A quantum circuit for Shor's factoring algorithm using 2n+2 qubits," Quantum Information and Computation, 6(2):184-192 (2006) are used. The correctness of the example circuits is then verified using simulations and present numerical evidence for the correctness of the cost estimates in Section V. Finally, in Section V A, example advantages for having Toffoli-based networks in quantum computing are discussed in more detail.

II. Toffoli-Based In-Place Addition

One possible way to construct an (inefficient) adder is to note that one can calculate the final bit $r_{n-1}$ of the result r=a+c using n-1 borrowed dirty qubits g. By borrowed dirty qubits, what is meant is that the qubits are in an unknown initial state and must be returned to this state. Embodiments of the disclosed CARRY circuit do not rely on any classical ripple-carry adders, but instead are constructed from scratch, which allows one to save $\mathcal{O}$ (n) NOT gates as follows.

Since there is no way of determining the state of the g-register without measuring, one can only use toggling of qubits to propagate information. For particular embodiments, it was chosen to encode the carry using such qubits, e.g., the toggling of qubit $g_i$, which is denoted as $g_i=1$, indicates the presence of a carry from bit i to bit i+1 when adding the constant c to the bits of a. Thus, $g_i$ must toggle if (at least) one of the following statements is true:

$a_i = c_i = 1$, $g_{i-1} = a_i = 1$, or $g_{i-1} = c_i = 1$.

If $c_i=1$, one must toggle $g_{i+1}$ if $a_i=1$, which can be achieved by placing a CNOT gate with target $g_{i+1}$ and control $a_i=1$. Furthermore, there may be a carry when $a_i=0$ but $g_{i-1}=1$. This is easily solved by inverting $a_i$ and placing a Toffoli gate with target $g_i$, conditioned on $a_i$ and $g_{i-1}$. If, on the other hand, $c_i=0$, the only way of generating a carry is for $a_i=g_{i-1}=1$, which can be solved with the Toffoli gate from before.

Thus, in summary, one places the Toffoli gate conditioned on $g_{i-1}$ and $a_i$, with target $g_i$ and, if $c_i=1$, one first adds a CNOT and a NOT gate. This classical conditioning during circuit-generation time is indicated by colored (shaded) gates in schematic block diagram 200 of FIG. 2. In order to apply the Toffoli gate conditioned on the toggling of $g_{i-1}$, one places it before the potential toggling, and then again afterwards such that if both are executed, the two gates cancel. Finally, the borrowed dirty qubits and the qubits of a need to be restored to their initial state (except for the highest bit of a, which now holds the result). This is done by running the entire circuit backwards, ignoring all gates acting on $a_{n-1}$.

Figure 2:
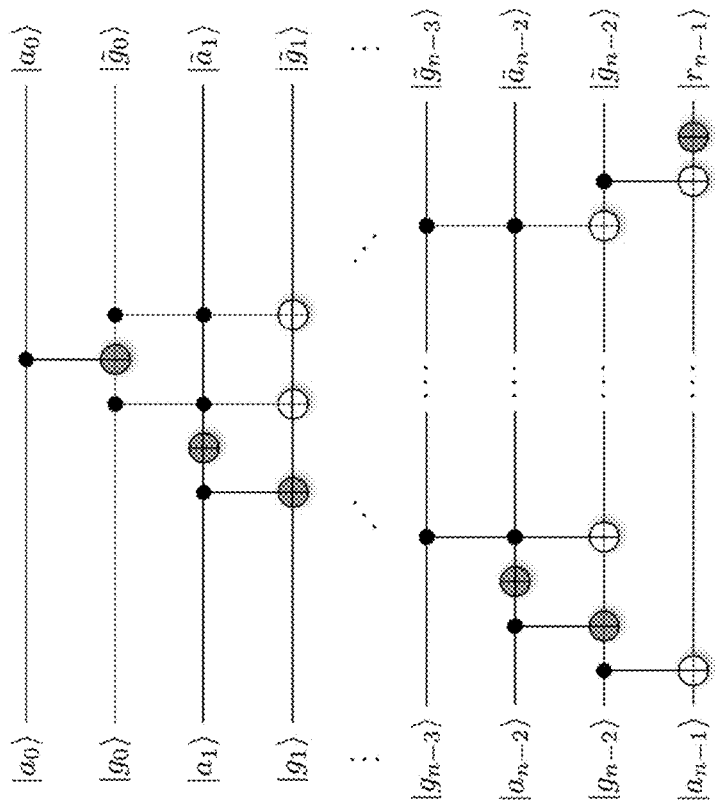
FIG. 2 is a schematic diagram showing an example computation of the most significant (MSB) carry bit for a constant addition of a value c.

More specifically, schematic block diagram 200 of FIG. 2 shows an example circuit computing the last bit of r=a+c using dirty qubits g. An orange (shaded) gate acting on a qubit with index i should be dropped if the i-th bit of the constant c is 0. The entire sequence should be run again in reverse (without the gates acting on $a_{n-1}$) in order to reset all qubits to their initial value except for $r_{n-1}$.

One can save the qubit $g_0$ in FIG. 2 by conditioning the Toffoli gate acting on $g_1$ directly on the value of $a_0$ (instead of testing for toggling of $g_0$). If $c_0=0$, the two Toffoli gates can be removed altogether since the CNOT acting on $g_0$ would not be present and the two Toffolis would cancel. If, on the other hand, $c_0=1$, the two Toffoli gates can be replaced by just one, conditioned on $a_0$. See circuit 400 of FIG. 4 for the complete circuit computing the last bit of a when adding the constant c=11.

Figure 3:
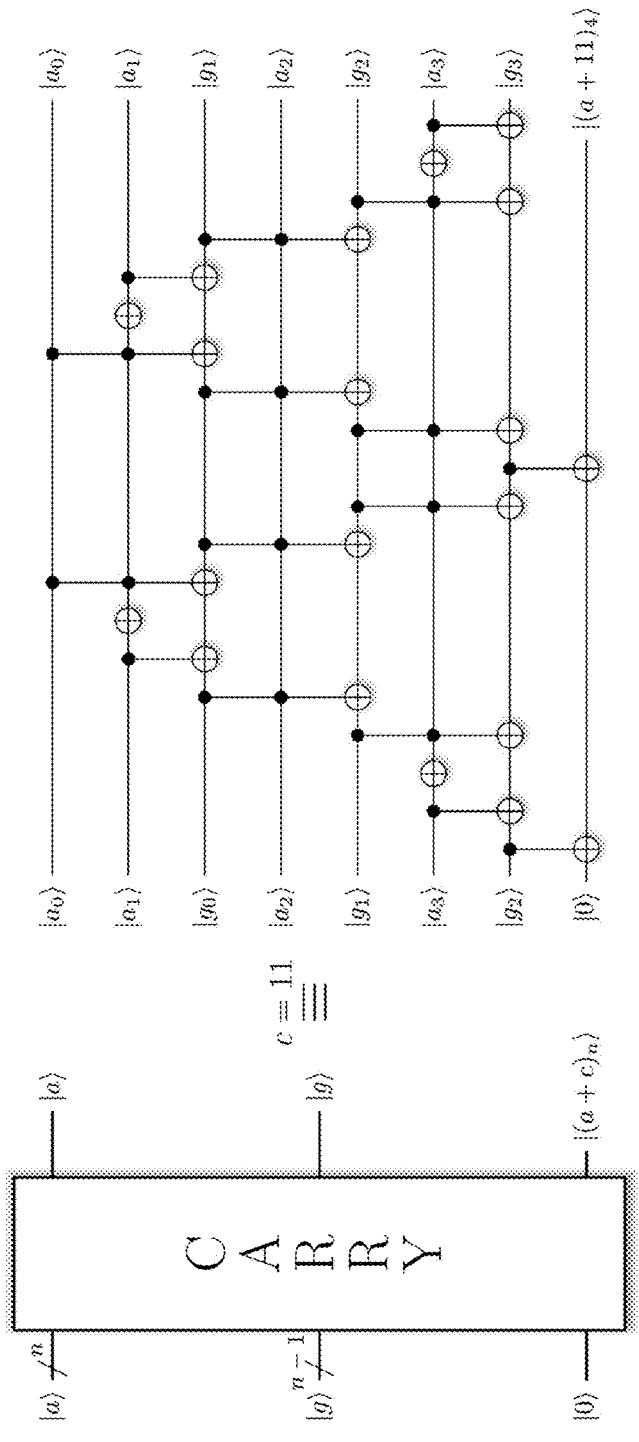
FIG. 3 is a schematic diagram showing the computation of the most significant (MSB) carry bit for a constant addition of a value c based on the subcircuit of FIG. 2.

FIG. 3 is a schematic block diagram 300 showing an example circuit computing the final carry of r=a+11 derived from the construction depicted in the circuit 200 of FIG. 2. The binary representation of the constant c is $c=11=1011_2$, e.g., the orange (shaded) gates in FIG. 2 acting on qubit index 2 have been removed since $c_2=0$. Furthermore, the optimization mentioned in the text has been applied, allowing to remove $g_0$ in FIG. 2.

If one were to iteratively calculate the bits n–2, ..., 1,0, one would arrive at an $O(n^2)$-sized addition circuit using n–1 borrowed dirty ancilla qubits. This is the same size as the Fourier addition circuit (see, e.g., Thomas G Draper, "Addition on a quantum computer," arXiv preprint quant-ph/0008033 (2000)), unless one uses an approximate version of the quantum Fourier transform bringing the size down to $$\mathcal{O}\left(n\log\frac{n}{\varepsilon}\right).$$

See, e.g., Richard Cleve and John Watrous, "Fast parallel circuits for the quantum fourier transform," in Foundations of Computer Science, 2000, Proceedings. 41st Annual Symposium on, pages 526-536 (IEEE, 2000). This example construction can be further improved to arrive at a size in $\mathcal{O}$ (n log n), as explained in the next subsection.

III. Example Serial Implementation

An $\mathcal{O}$ (n log n)-sized addition circuit can be achieved by applying a divide-and-conquer scheme to the addition idea mentioned above (see FIG. 4), together with an incrementer (e.g., the incrementer proposed in Craig Gidney, "StackExchange post: Creating bigger controlled nots from single qubit, Toffoli, and CNOT gates, without workspace," http://cs.stackexchange.com/questions/40933/ (2015) (hereinafter "Gidney"), which runs in $\mathcal{O}$ (n)). Since many dirty ancillae are available in the example recursive construction, the n-borrowed qubits incrementer (e.g., as in Gidney) is sufficient: Using an ancilla-free adder (e.g., as in Yasuhiro Takahashi, Seiichiro Tani, and Noboru Kunihiro, "Quantum addition circuits and unbounded fan-out," arXiv preprint arXiv:0910.2530 (2009)), which requires no incoming carry, and its reverse to perform subtraction, one can perform the following sequence of operations to achieve an incrementer using n borrowed ancilla qubits in an unknown initial state $|g\rangle$:

$$|x\rangle|g\rangle \mapsto |x-g\rangle|g\rangle$$
$$\mapsto |x-g\rangle|g'-1\rangle$$
$$\mapsto |x-g-g'+1\rangle|g'-1\rangle$$
$$\mapsto |x+1\rangle|g\rangle,$$

where g' denotes the two's-complement of g and g'–1=$\bar{g}$, the bit-wise complement of g. A conditional incrementer can be constructed by either using two controlled adders as explained, or by applying an incrementer to a register containing both the target and control qubits of the conditional incrementer, where the control qubit is now the least significant bit. Then, the incrementer can be run on the larger register, followed by a final NOT gate acting on the control qubit (since it will always be toggled by the incrementer). In the latter version, one can either use one more dirty ancilla qubit for cases where n mod 2=0 or, alternatively, split the incrementer into two smaller ones (e.g., as done in Gidney). In this discussion, the construction with an extra dirty qubit is used, since there are plenty of idle qubits available in Shor's algorithm.

Figure 4:
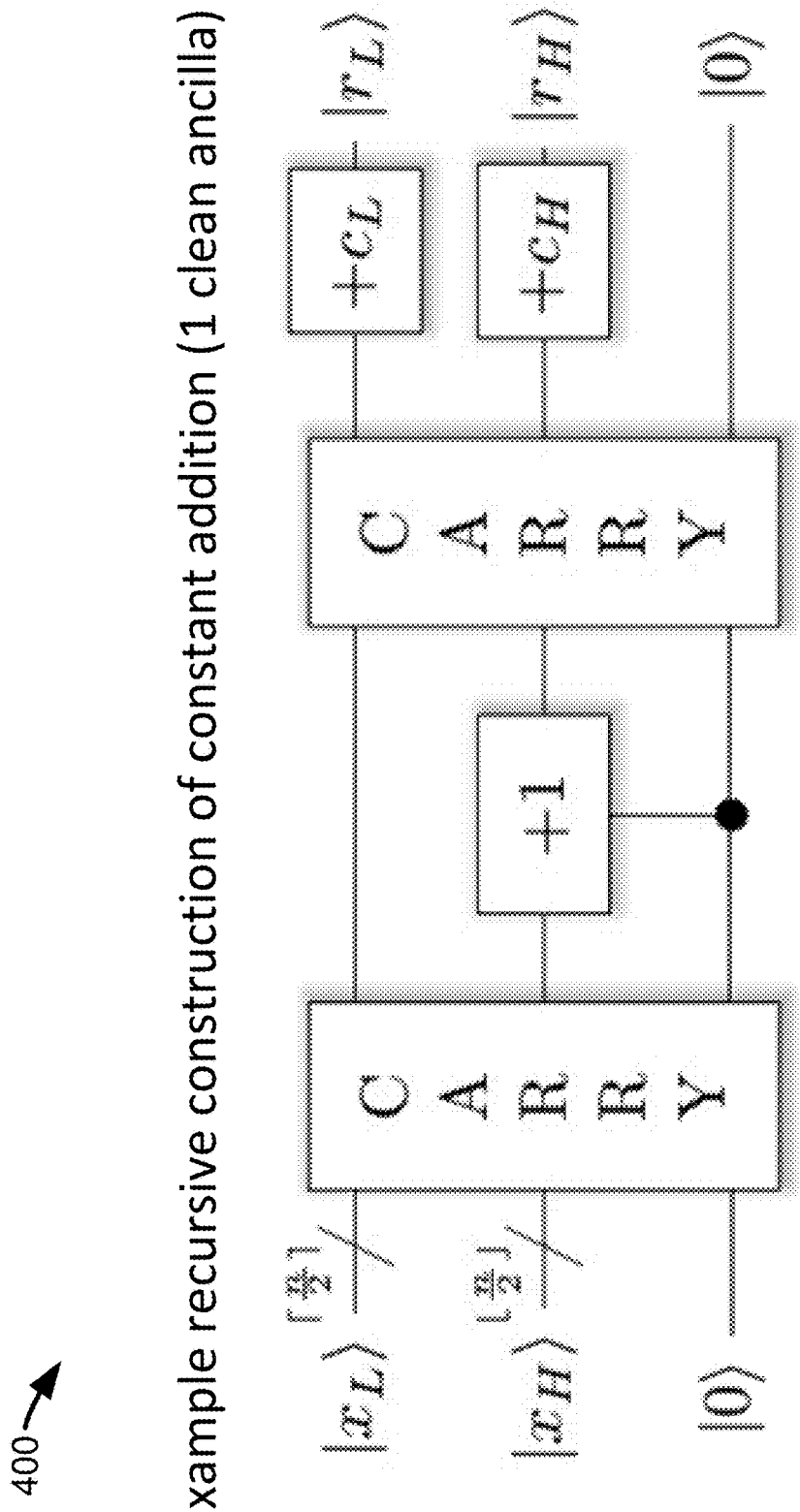
FIG. 4 is a schematic diagram illustrating an example recursive decomposition of a circuit for addition of a constant c by using two carry circuits using one clean ancilla, one conditional addition of the value 1, and two smaller addition circuits.

In order to make the circuit depicted in FIG. 4 work with a borrowed dirty qubit, the incrementer is desirably run twice with a conditional inversion in between. The resulting circuit can be seen in FIG. 5. At the lowest recursion level, only 1-bit additions are performed, which can be implemented as a NOT gate on $x_i$ if $c_i=1$; all carries are accounted for earlier.

More specifically, FIG. 4 shows an example circuit for adding the constant a to the register x. $x_H$ and $x_L$ denote the high- and low-bit part of x. The CARRY gate computes the carry of the computation $x_L+a_L$ into the qubit with initial state $|0\rangle$, borrowing the $x_H$ qubits as dirty ancillae. This carry is then taken care of by an incrementer gate acting on the high-bits of x. Applying this construction recursively yields an $\mathcal{O}$ (n log n) addition circuit with just one ancilla qubit (the $|0\rangle$ qubit in this figure).

Figure 5:
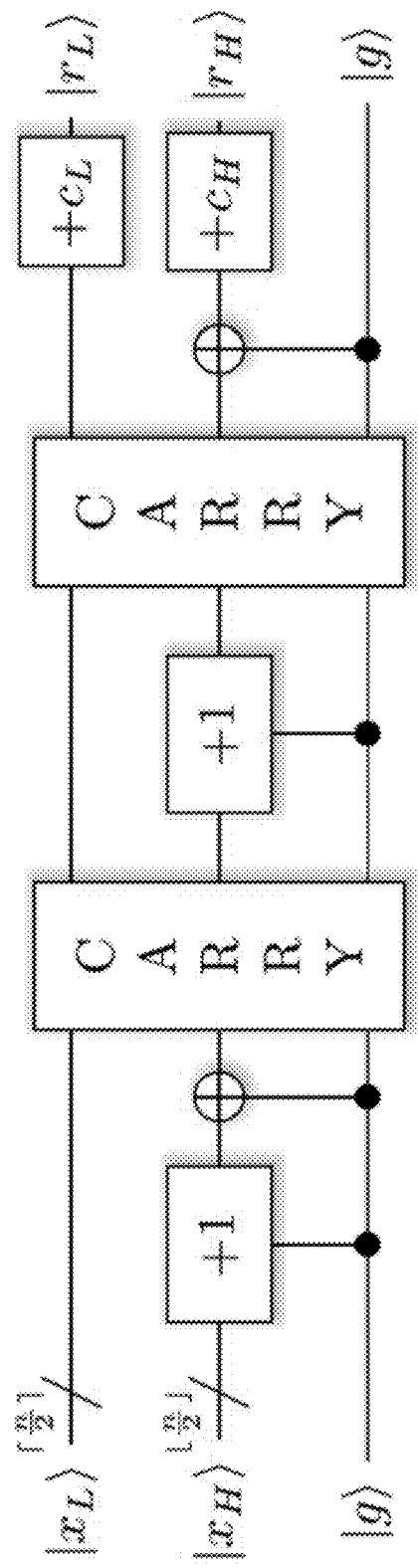
FIG. 5 is a schematic diagram illustrating an example recursive decomposition of a circuit for addition of a constant c by using two carry circuits using one dirty ancilla, one conditional addition of the value 1, and two smaller addition circuits.

FIG. 5 shows an example circuit 500 of FIG. 4 for the case when the ancilla qubit is dirty (unknown initial state $|g\rangle$, left unchanged by the computation).

A. Runtime Analysis of the Serial Implementation

In the example serial version discussed above, the one borrowed dirty ancilla qubit was reused to hold the output of the CARRY gate, which is implemented as shown in FIG. 3. The CARRY gate has a Toffoli count of $T_{carry}(n)=4n+\mathcal{O}$ (1) (including the uncomputation of the ancilla qubits) and the controlled incrementer using n borrowed dirty qubits features a Toffoli count of $T_{incr}(n)=4n+\mathcal{O}$ (1) (2 additions). Both of these circuits have to be run twice on roughly $$\frac{n}{2}$$

quoits. Therefore, the first part of the recursion has a Toffoli count of $T_{rec}(n)=8n+\mathcal{O}$ (1). The recursion for the Toffoli count $T_{add}(n)$ of the entire addition circuit thus yields $$T_{add}(n) = T_{add}\left(\left\lceil \frac{n}{2} \right\rceil\right) + T_{add}\left(\left\lfloor \frac{n}{2} \right\rfloor\right) + T_{rec}(n)$$
$$= 8n\log_2 n + \mathcal{O}(n).$$

For a controlled addition, only the two CNOT gates acting on the last bit in FIG. 3 need to be turned into their controlled versions, which is another desirable property of this construction.

B. Parallel/Lower-depth Version

Figure 6:
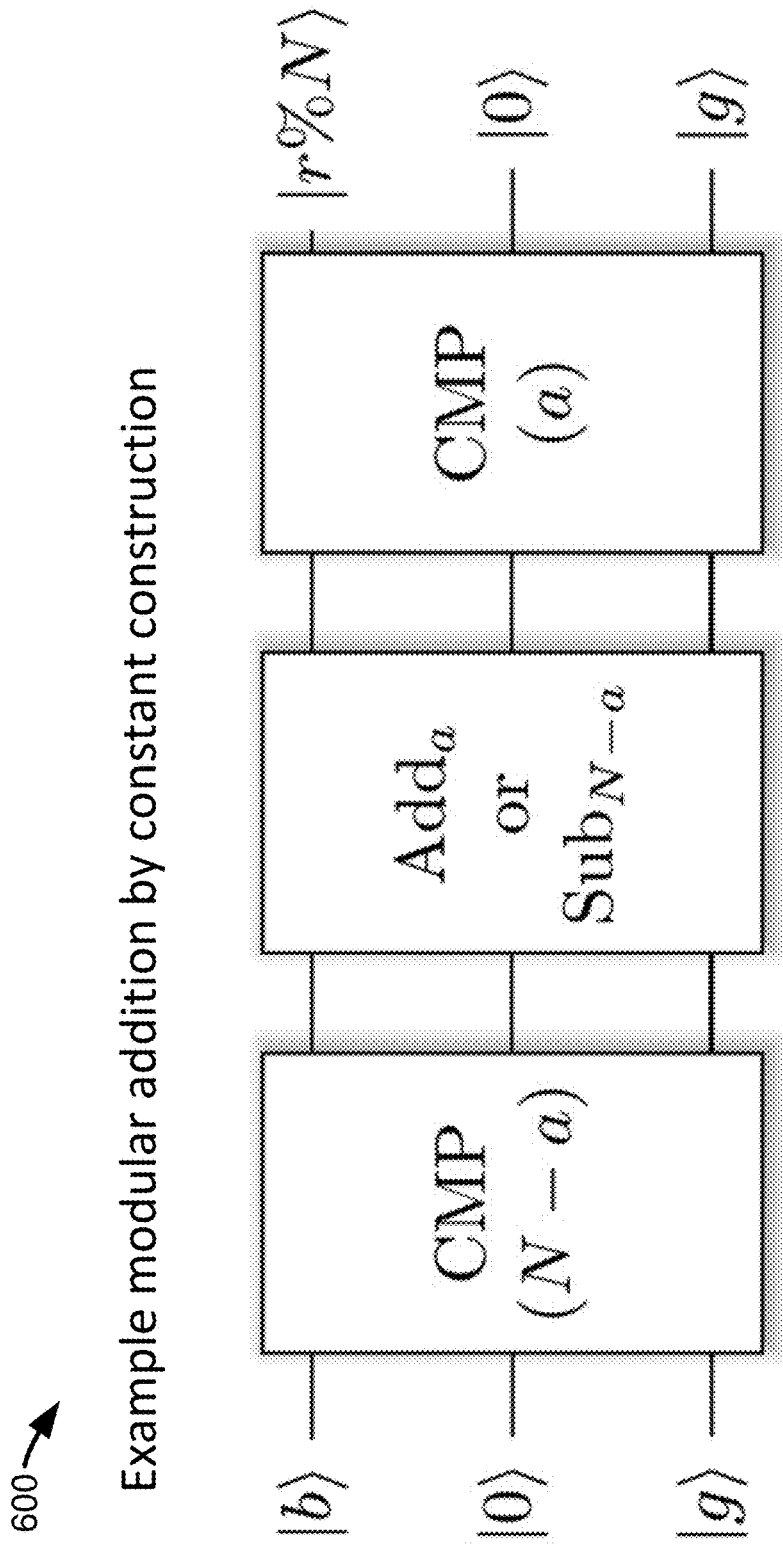
FIG. 6 is a schematic diagram that illustrates an example of how a modular addition circuit can be obtained from two comparator circuits and one integer addition or subtraction circuit.

If the underlying hardware supports parallelization, one can compute the carries for the additions $+c_L$ and $+c_H$ in FIG. 4 in parallel, at the cost of one extra qubit in state $|0\rangle$ which will then hold the output of the CARRY computation of $+c_H$. Doing this recursively and noting that there must be at least two qubits of x per CARRY gate, one sees that this circuit can be parallelized at a cost of $$\frac{n}{2}$$

ancilla qubits in state $|0\rangle$. Using the construction depicted in FIG. 5 allows one to use $$\frac{n}{2}$$

borrowed dirty qubits instead. To see that this construction can be used in example implementations of Shor's algorithm, consider that during the modular multiplication $$|x\rangle |0\rangle \mapsto |x\rangle |(ax) \bmod N\rangle,$$

additions are performed into the second register, conditioned on the output of the comparator in FIG. 6. Therefore, n qubits of the x-register are readily available to be used as borrowed dirty qubits, thus reducing the depth of the example addition circuit to $\mathcal{O}$ (n).

Figure 25:
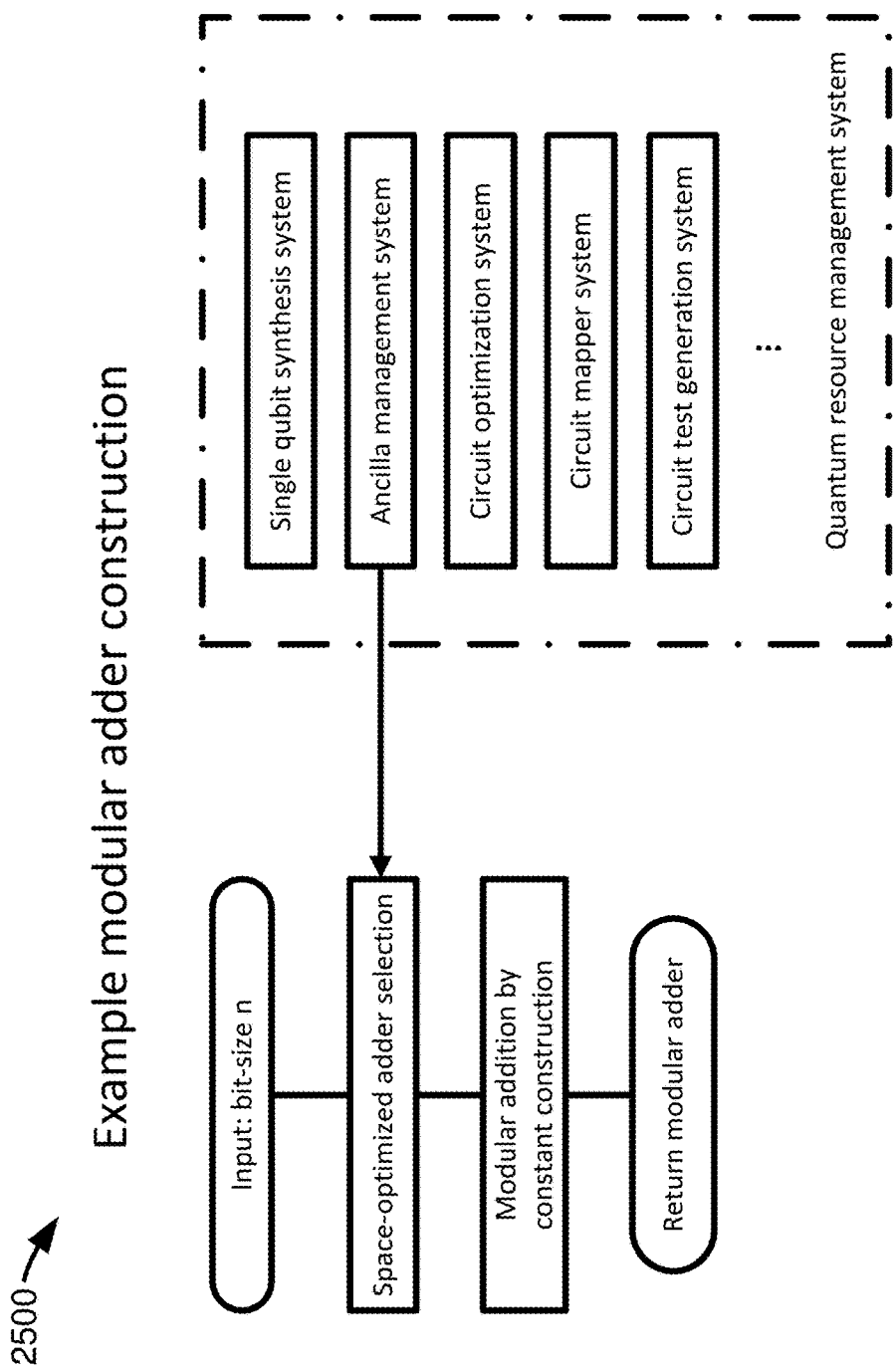
FIG. 25 is a schematic diagram illustrating an example of the construction of an integer addition circuit by a constant value for a given bit-size n, where the selection process uses the ancillas management module of a quantum resource management system.
Figure 26:
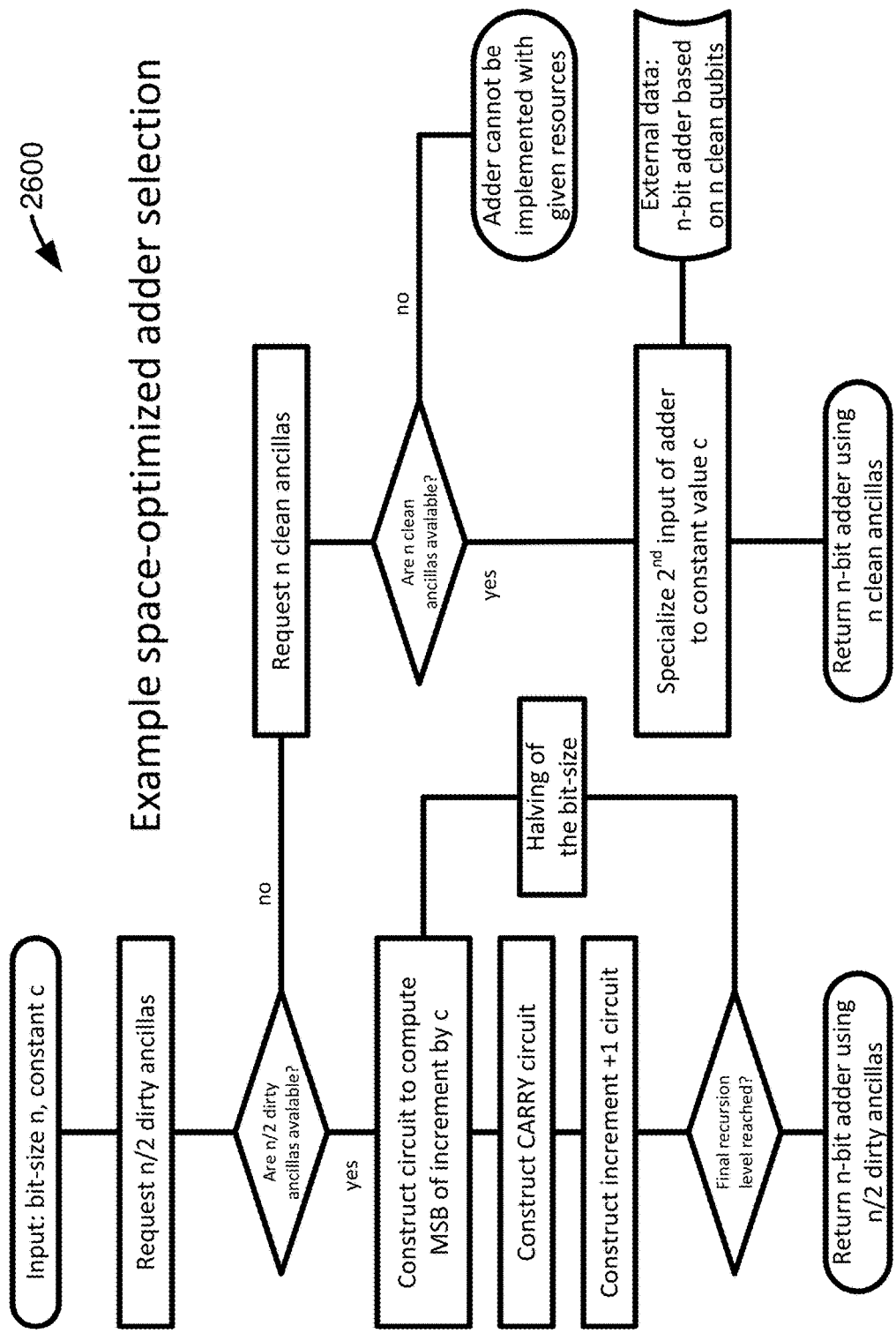
FIG. 26 is a schematic diagram illustrating an example flow of decisions involved in selecting an integer addition circuit by a constant value for a given bit-size n and a given constant c, depending on specific numbers of dirty, respective, clean, ancilla qubits that can be provided by an exemplary ancilla management system.

An example selection process for choosing a modular adder is shown in schematic block diagram 2500 of FIG. 25. To achieve a space-optimized implementation of a modular adder, the compiler system of the illustrated example makes calls to operations provided by a quantum resource management system configured to perform a management process of ancillas (e.g., clean and dirty ancillas). A further description of a possible embodiment of an ancilla management system is shown in schematic block diagram 1200 of FIG. 12. Flow chart 2600 of FIG. 26 shows a possible flow chart for how to pick a suitable modular adder, depending on how many dirty and clean ancillas are available.

IV. Modular Multiplication

The modular multiplier can be constructed from a modular addition circuit using a repeated-addition-and-shift approach (e.g., as done in Stephane Beauregard, "Circuit for Shor's algorithm using 2n+3 qubits," Quantum Information and Computation, 3(2):175-185 (2003); Yasuhiro Takahashi and Noboru Kunihiro, "A quantum circuit for Shor's factoring algorithm using 2n+2 qubits," Quantum Information and Computation, 6(2):184-192 (2006):

$$(ax) \bmod N = (a(x_{n-1}2^{n-1} + \ldots + x_0 2^0)) \bmod N$$
$$= (((a2^{n-1}) \bmod N)x_{n-1} + \ldots + ax_0),$$

where $x_{n-1}, \ldots, x_0$ is the binary expansion of x, and addition is carried out modulo N. Since $x_i \in \{0, 1\}$, this can be viewed as modular additions of $(a2^i) \bmod N$ conditioned on $x_i=1$. In one example, certain transformations allow one to construct an efficient modulo-N addition circuit from a non-modular adder. For an illustration of one example procedure, see example circuit 600 of FIG. 6 where the comparator can be implemented by applying the example carry circuit disclosed herein on the inverted bits of b. Also, note that it is sufficient to turn the final CNOT gates (see FIG. 3) of the comparator in FIG. 6 into Toffoli gates in order to arrive at controlled modular addition, since the subsequent add/subtract operation is executed conditionally on the output of the comparator.

The repeated-addition-and-shift algorithm transforms the input registers $|x\rangle|0\rangle \mapsto |x\rangle|(a \cdot x) \bmod N\rangle$. In Shor's algorithm, 2n such modular multiplications are required and in order to keep the total number of 2n+2 qubits constant, the uncompute method from Stephane Beauregard, "Circuit for Shor's algorithm using 2n+3 qubits," Quantum Information and Computation, 3(2):175-185 (2003) can be used: After swapping the two n-qubit registers, one runs another modular multiplication circuit, but this time using subtraction instead of addition and with a new constant of multiplication, namely the inverse $a^{-1}$ of a modulo N. This achieves the transformation $$|x\rangle|(ax)\bmod N\rangle \mapsto |(ax)\bmod N\rangle|x\rangle$$
$$\mapsto |(ax)\bmod N\rangle|(x - a^{-1}ax)\bmod N\rangle$$
$$= |(ax)\bmod N\rangle|0\rangle,$$

as desired. In total, this procedure requires 2n+1 qubits: 2n for the two registers and 1 to achieve the modular addition depicted in example 600 of FIG. 6.

Figure 27:
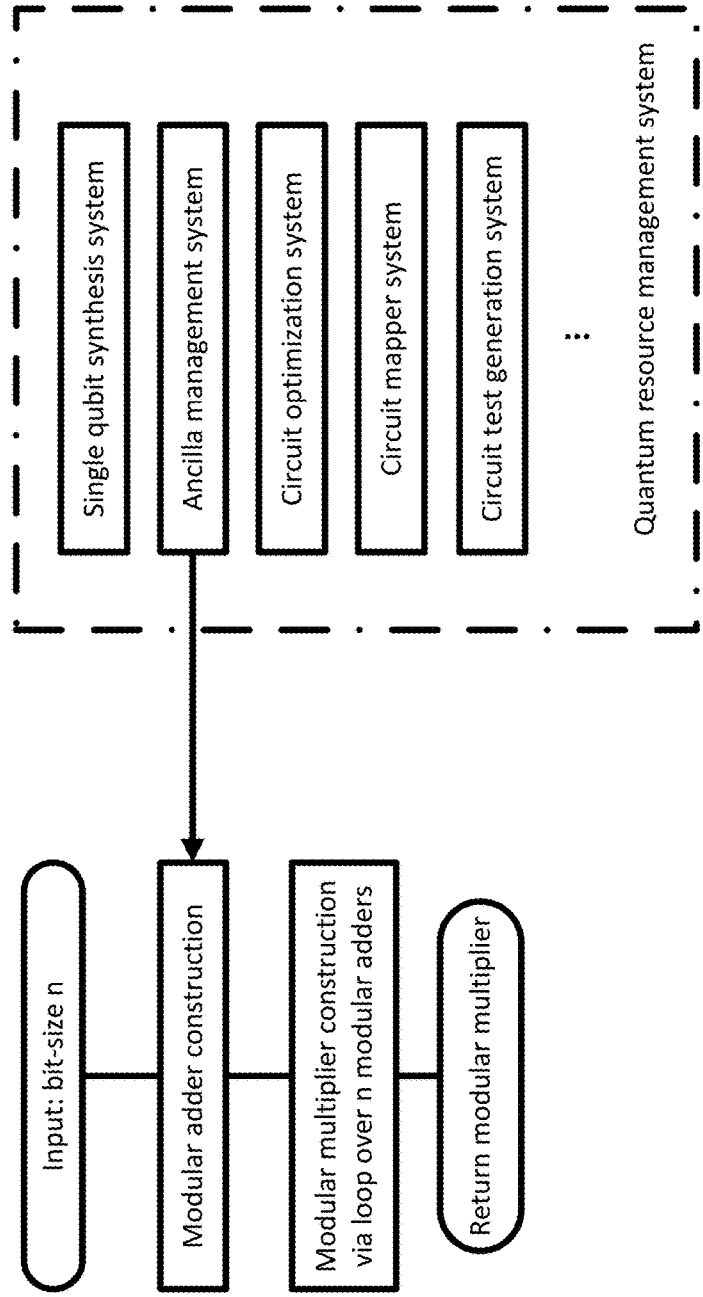
FIG. 27 is a schematic diagram illustrating an example of the construction of a modular multiplication circuit, where the selection process uses an exemplary ancilla management module of a quantum resource management system.
Figure 28:
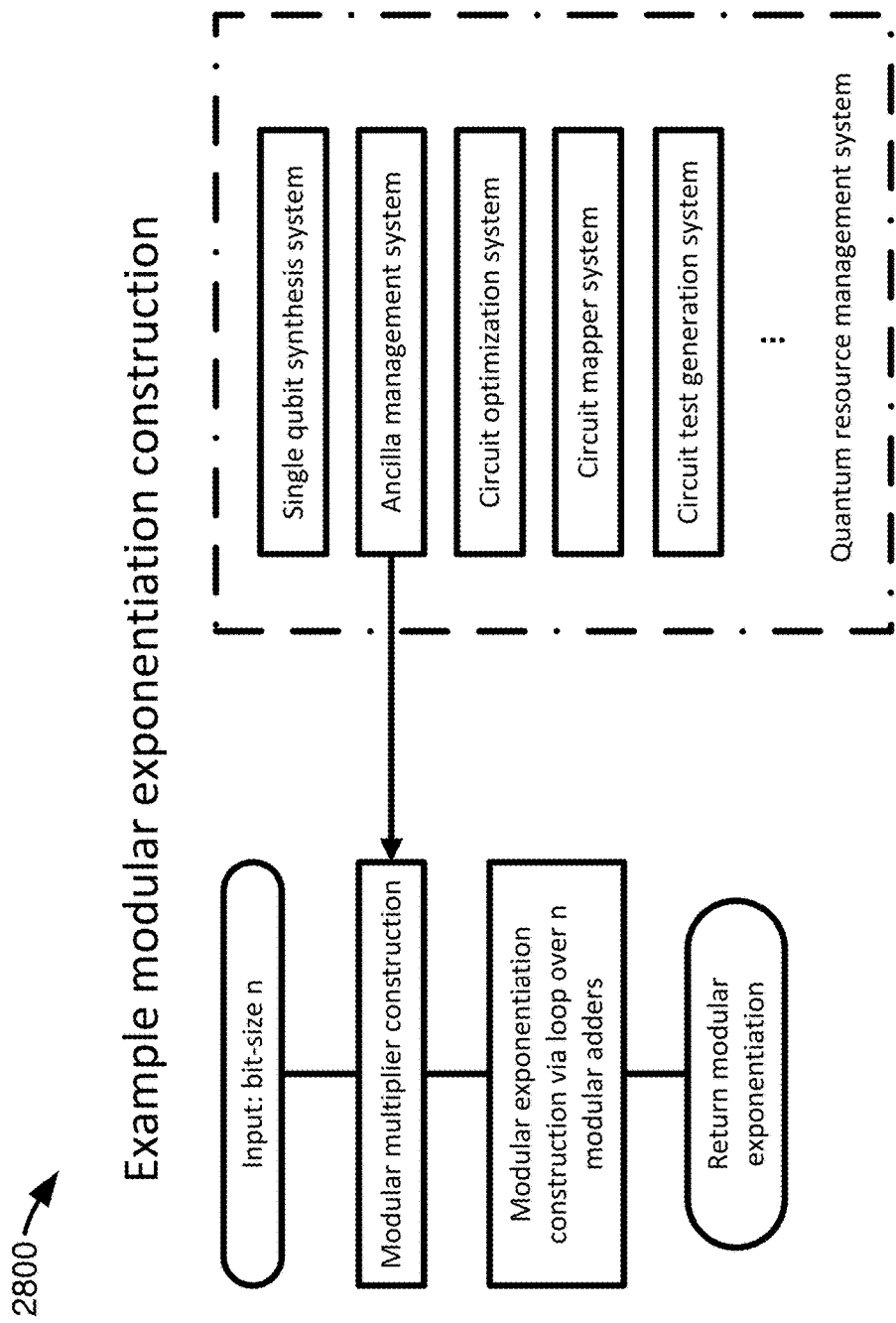
FIG. 28 is a schematic diagram illustrating an example of the construction of a modular exponentiation circuit, where the selection process uses an exemplary ancilla management module of a quantum resource management system.

An example selection processes for choosing a modular multiplier and a modular exponentiation circuit are shown in example circuits 2700 and 2800 of FIGS. 27 and 28. As in the case of the modular addition, to achieve a space-optimized implementation of a modular adder, the compiler system might make calls to operations provided by a quantum resource management system, such as the management of ancillas.

More specifically, example circuit 600 of FIG. 6 shows an example construction of an example modular adder $|b\rangle \mapsto |r \bmod N\rangle$ with r=a+b, using a non-modular adder. The CMP gate compares the value in register b to the classical value N−a, which can be implemented using the disclosed carry gate. The result indicates whether b<N−a, e.g., it indicates whether one should add a or a−N. Finally, the indicator qubit is reset to $|0\rangle$ using another comparison gate. In the example implementation, the add/subtract operation uses between 1 (serial) and $$\frac{n}{2}$$

(parallel) qubits of g.

V. Implementation and Experimental Results

In Shor's algorithm, a controlled modular multiplier is used for the modular exponentiation which takes the form of a quantum phase estimation, since $$a^x \bmod N = a^{2^{n-1}x_{n-1} + 2^{n-2}x_{n-2} \cdots + x_0} \bmod N$$
$$= a^{2^{n-1}x_{n-1}} \cdot a^{2^{n-2}x_{n-2}} \cdots a^{x_0},$$

where again $x_i \in \{0, 1\}$ and multiplication is carried out modulo N. Thus, modular exponentiation can be achieved using modular multiplications by constants $\tilde{a}_i$ conditioned on $x_i=1$, where $$\tilde{a}_i = a^{2^i} \bmod N.$$

In particular embodiments of the disclosed technology, one does not have to condition the innermost adders; instead, one can add two controls to the comparator gates in FIG. 6, which turns the CNOT gates acting on the last bit in FIG. 3 into 3-qubit-controlled-NOT gates, which can be implemented using 4 Toffoli gates and one of the idle garbage qubits of g. Note that there are n idle qubits available when performing the controlled addition/subtraction in FIG. 6 (n−1 qubits in g plus the $x_i$ qubit the comparator was conditioned upon). The controlled addition/subtraction circuit can thus borrow $$\frac{n}{2}$$

dirty qubits from the g register to achieve the parallelism mentioned in subsection III A.

To test embodiments of the disclosed circuits, the controlled modular-multiplier performing the operation $$|x\rangle|0\rangle \mapsto |x\rangle|(ax)\bmod N\rangle$$
$$\mapsto |(ax)\bmod N\rangle|0\rangle$$

was simulated in the LIQUi$|\rangle$ quantum software architecture. See Dave Wecker and Krysta M Svore, "LIQUi$|\rangle$: A software design architecture and domain-specic language for quantum computing," arXiv preprint arXiv:1402.4467 (2014) In doing so, LIQUi$|\rangle$ was extended by a reversible circuit simulator to enable large scale simulations of Toffoli-based circuits.

To test the example circuit designs and gate estimates, the example circuits circuits were simulated on input sizes of up to 8, 192-bit numbers. The scaling results of the Toffoli count $T_{mult}(n)$ of the example controlled modular-multiplier embodiments are as expected. Each of the two (controlled) multiplication circuits (namely compute/uncompute) use n (doubly-controlled) modular additions. The modular addition is constructed using two (controlled) addition circuits, which have a Toffoli count of $T_{add}(n)=8n \log_2 n + \mathcal{O}(n)$. Thus one has $$T_{mult}(n) = 4nT_{add}(n) = 32n^2 \log_2 n + \mathcal{O}(n^2).$$

Figure 7:
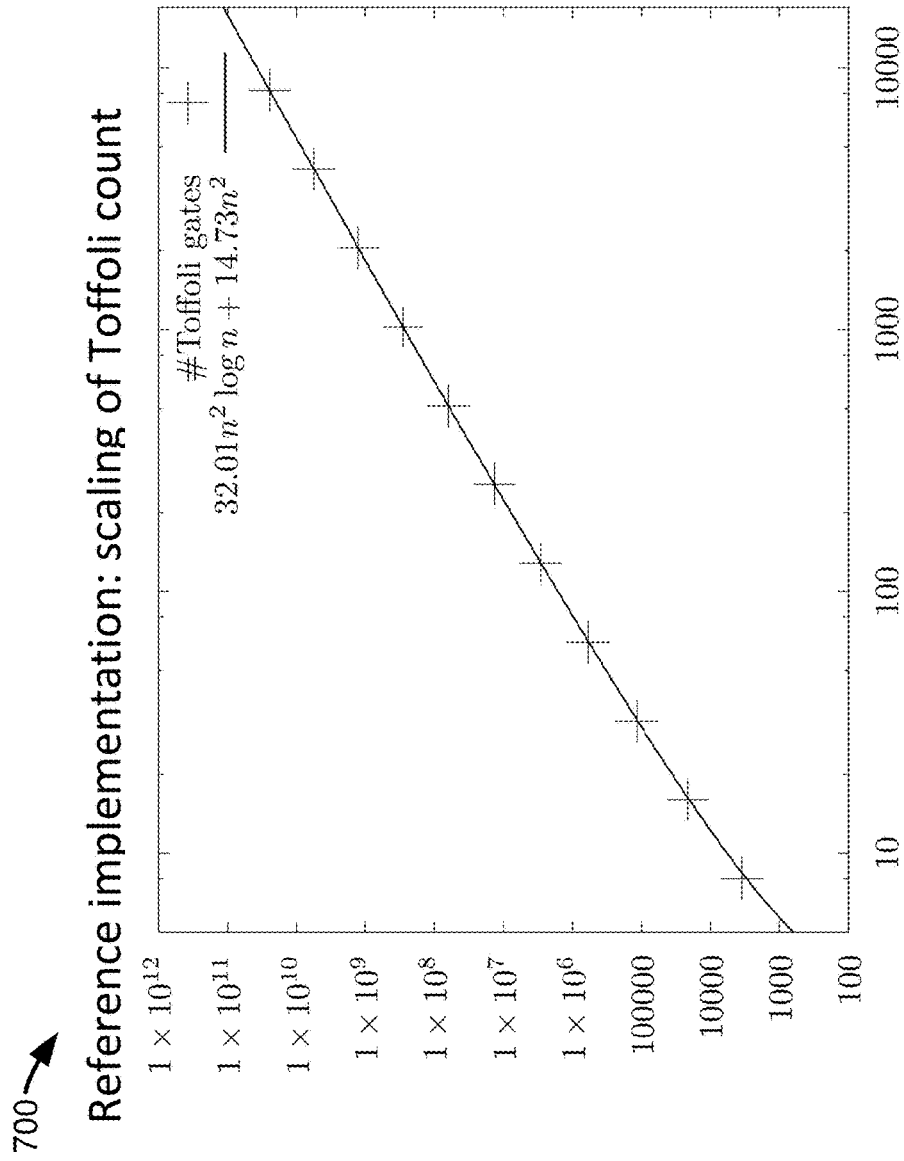
FIG. 7 is a data plot showing the size of examples constructed circuits for a single modular exponentiation used in Shor's algorithm. Shown are various bit-sizes n, where the size of the circuit is measured as the number of Toffoli gates, and where the size scales as $32.01n^2 \log n + 14.73n^2$.

The experimental data and the fit confirm this expected scaling, as shown in FIG. 7. Since 2n modular multiplications have to be carried out for an entire run of Shor's algorithm, the overall Toffoli count is $$T_{Shor}(n) = 64n^3 \log n + \mathcal{O}(n^3).$$

In particular, FIG. 7 is a schematic block diagram 700 showing the scaling of the Toffoli count $T_M(n)$ with bit size n for the controlled modular multiplier. Each data point represents a modular multiplication run (including uncompute of the x-register) using $n=2^m$ bits for each of the two registers, with $m \in \{3, \ldots, 14\}$.

A. Realizable Advantages of Toffoli Circuits

This section describes various advantages that can be achieved using embodiments of the disclosed circuits, any one or more of which may be realized in a particular implementation.

B. Single-Qubit Rotation Gate Synthesis

In order to apply a QEC scheme, arbitrary rotation gates are decomposed into sequences of gates from a (universal)

discrete gate set—a process called gate synthesis—for which an algorithm such as the ones in Vadym Kliuchnikov, Dmitri Maslov, and Michele Mosca, "Practical approximation of single-qubit unitaries by single-qubit quantum clifford and t circuits," arXiv preprint arXiv:1212.6964 (2012); Neil J Ross and Peter Selinger, "Optimal ancilla-free clifford+t approximation of z-rotations," arXiv preprint arXiv:1403.2975 (2014); Alex Bocharov, Martin Roetteler, and Krysta M Svore, "Efficient synthesis of probabilistic quantum circuits with fallback," Physical Review A, 91(5): 052317 (2015) may be used. One example of a universal discrete gate set comprises the Pauli gates ($\sigma_x$, $\sigma_y$, $\sigma_z$), CNOT, Hadamard, and the $$T \text{ gate} \begin{pmatrix} 1 & 0 \\ 0 & e^{i\pi/4} \end{pmatrix}.$$

The syntnesis implies a growth on the order of $$\Theta\left(\log\frac{1}{\varepsilon}\right)$$

in the total number of gates, where $\varepsilon$ denotes the target precision of the synthesis.

In space-efficient implementations of Shor's algorithm (see, e.g., Stephane Beauregard, "Circuit for Shor's algorithm using 2n+3 qubits," Quantum Information and Computation, 3(2):175-185 (2003); and Yasuhiro Takahashi and Noboru Kunihiro, "A quantum circuit for Shor's factoring algorithm using 2n+2 qubits," Quantum Information and Computation, 6(2):184-192 (2006)), the angles of the approximate QFT (AQFT) require synthesis. Since the approximation cutoff is introduced at m ∈ $\Theta$(log n), the smallest Fourier angles are $$\theta_m \in \Theta\left(\frac{1}{2^m}\right)$$

(see, e.g., Adriano Barenco, Artur Ekert, Kalle-Antti Suominen, and Paivi Torma, "Approximate quantum fourier transform and decoherence," Physical Review A, 54(1):139 (1996)). Hence, the target precision $\varepsilon$ of the synthesis can be estimated to be in $$\Theta\left(\frac{1}{n}\right)$$

and, thus, the overall gate count and depth of the previous circuits by Takahashi et al. and Beauregard are in $\Theta(n^3 \log^2 n)$ and $\Theta(n^3 \log n)$, respectively.

Toffoli-based networks as described herein, on the other hand, do not suffer from synthesis overhead. A Toffoli gate can be decomposed exactly into Clifford and T gates using 7 T-gates, or less if global phases can be ignored. See Adriano Barenco, Charles H Bennett, Richard Cleve, David P DiVincenzo, Norman Margolus, Peter Shor, Tycho Sleator, John A Smolin, and Harald Weinfurter, "Elementary gates for quantum computation," Physical review A, 52(5):3457 (1995); N. Cody Jones, "Novel constructions for the fault-tolerant Toffoli gate," Physical Review A, 87:022328 (2013). Therefore, the overall gate count and depth of the example circuit disclosed herein does not change and remains in $\Theta(n^3 \log n)$ and $\Theta(n^3)$, respectively.

C. Design for Testability

In classical computing, thoroughly tested hardware and software components are preferred over the ones that are not, especially for applications where system-failure could have catastrophic effects. The same may be true for quantum computing: both software and hardware are desirably tested in order to guarantee the correctness of each and every component involved in a computation for building large circuits such as the ones used for factoring using Shor's algorithm. While a full functional simulation may be possible for arbitrary circuits up to almost 50 qubits with high-performance simulators run on supercomputers (see, e.g., Thomas Haner, Damian S Steiger, Mikhail Smelyanskiy, and Matthias Troyer, "High performance emulation of quantum circuits, " arXiv preprint arXiv:1604.06460 (2016); Mikhail Smelyanskiy, Nicolas P D Sawaya, and Alan Aspuru-Guzik, "qhipster: the quantum high performance software testing environment," arXiv preprint arXiv: 1601.07195 (2016), simulating a moderately-sized quantum computer with just 100 qubits is not feasible on a classical computer due to the exponential scaling of the required resources. For reversible networks, on the other hand, classical reversible simulators can be used, which run the circuit on a computational basis state and only update one single state for each gate. This enables thorough testing of logical level circuits such as the modular multiplication circuit presented in this paper.

Furthermore, when reversible networks (e.g., Toffoli networks) are run on actual quantum hardware, the circuits can be debugged efficiently and faults can be localized using binary search. The idea is to run the actual physical implementation of the network (followed by final measurement in the computational basis or Z-basis (the basis of eigenstates of the Pauli Z-operator)) on a sample set of basis states which serve as test vectors to trigger the faults. As the measured distribution under correct operation is always close to a delta function in total variation distance, we have an efficient test if an error occurred in the entire network when executing it on a physical quantum machine.

At the same time, it is possible to simulate the execution of said reversible network on said sample set of basis states on a classical computer. This can be done efficiently as it requires updating of a binary vector under local bit operations, which can be done easily on a classical machine. The final bit vector can then be compared to the result from the simulation on the physical quantum machine.

Figure 17:
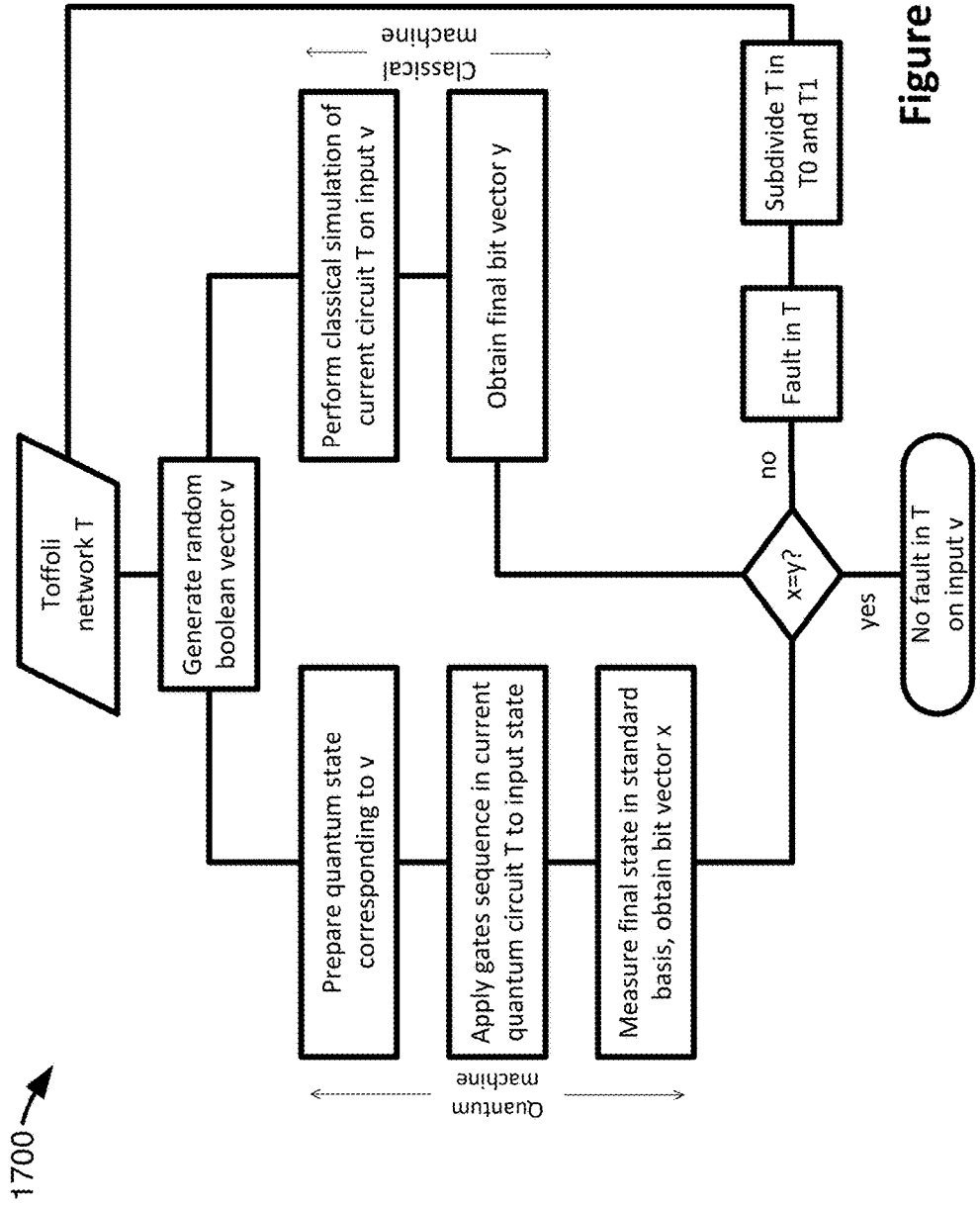
FIG. 17 is a schematic diagram showing an example fault-localization method for Toffoli circuits based on binary search based on an executing of said Toffoli network on a physical quantum computer and a simulation of said Toffoli network on a classical computer system.

For a given bit vector v this leads then to a test as shown in flowchart 1700 of FIG. 17 which can either lead to a fault (the branch x≠y in FIG. 17, where x denotes the result from the execution on the quantum machine and y denotes the result from the execution on the classical machine) in which case we know that at least one of the gates in the network T was implemented incorrectly. Or else in case of the branch x=y, we know that the particular choice of v on the particular run did not trigger an error. Still, repetition with the same random input v might be performed to increase the confidence in the quantum sampling. Also, different bit vectors v', v", etc. might be chosen to increase confidence.

Figure 18:
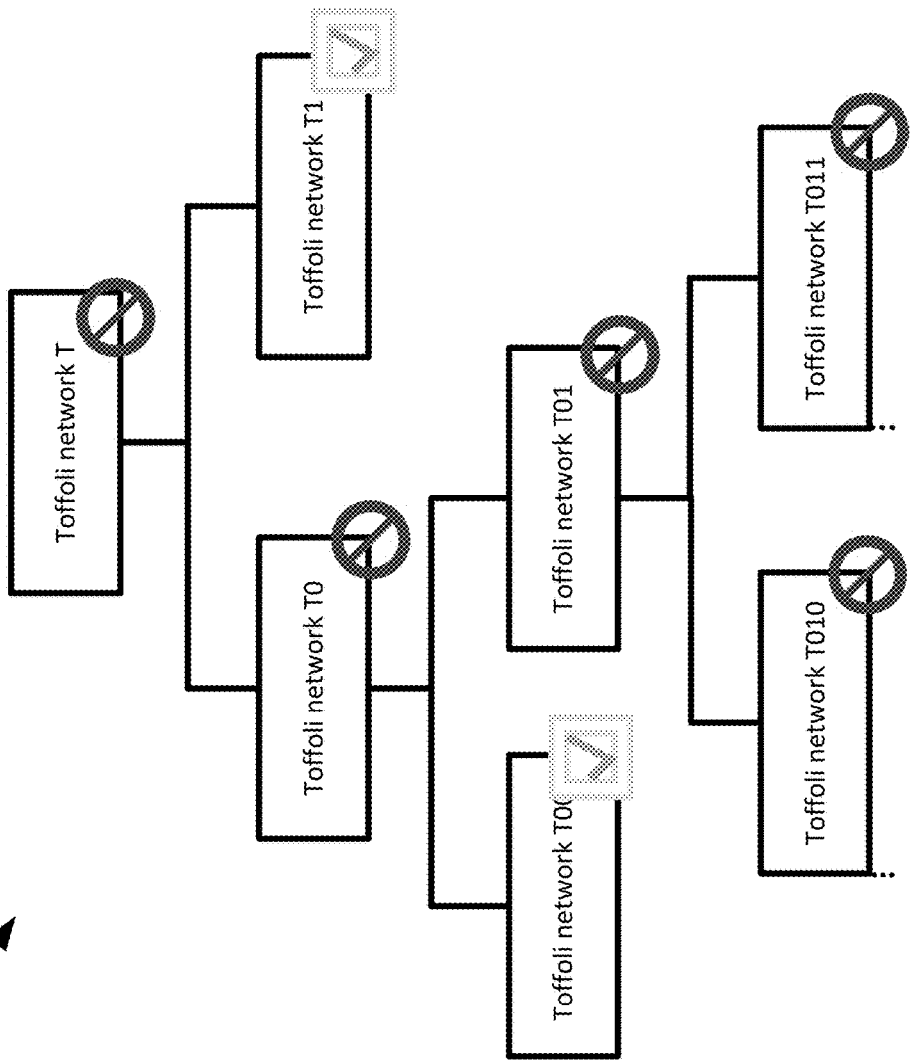
FIG. 18 is a schematic diagram showing 4 levels of the execution of an example fault-localization method for Toffoli circuits based on a binary search, wherein subcircuits that have successfully passed the tests are not subject to further testing whereas subcircuits that failed the tests are subject to recursive splitting and testing.

If faults were triggered, leading to errors in T, then a binary search technique can be used to subdivide the networks T in two parts $T_0$ and $T_1$ and recursively apply the procedure to both parts, using as input the ideal vectors obtained from the logical level simulation. FIG. 18 shows a flowchart 1800 of an example execution of said binary search strategy in case of a network T in which the first subnetwork $T_0$ has faults in its implementation that were triggered by the test shown in FIG. 17. The subnetwork $T_1$ passed all the test, so it is considered fault-free with a sufficient level of confidence. Subsequent subdivision of $T_1$ and subsequent testing allows to further narrow the location of faults in the physical implementation of T.

Eventually this will lead to localization of all faults that might be present in the implementation, provided that the choice of the initial sample set triggers all faults that might be present in the network. Note that this kind of debugging would not be possible for, e.g., QFT-based addition circuits, as intermediate states might be in superposition of exponentially many basis states.

Figure 19:
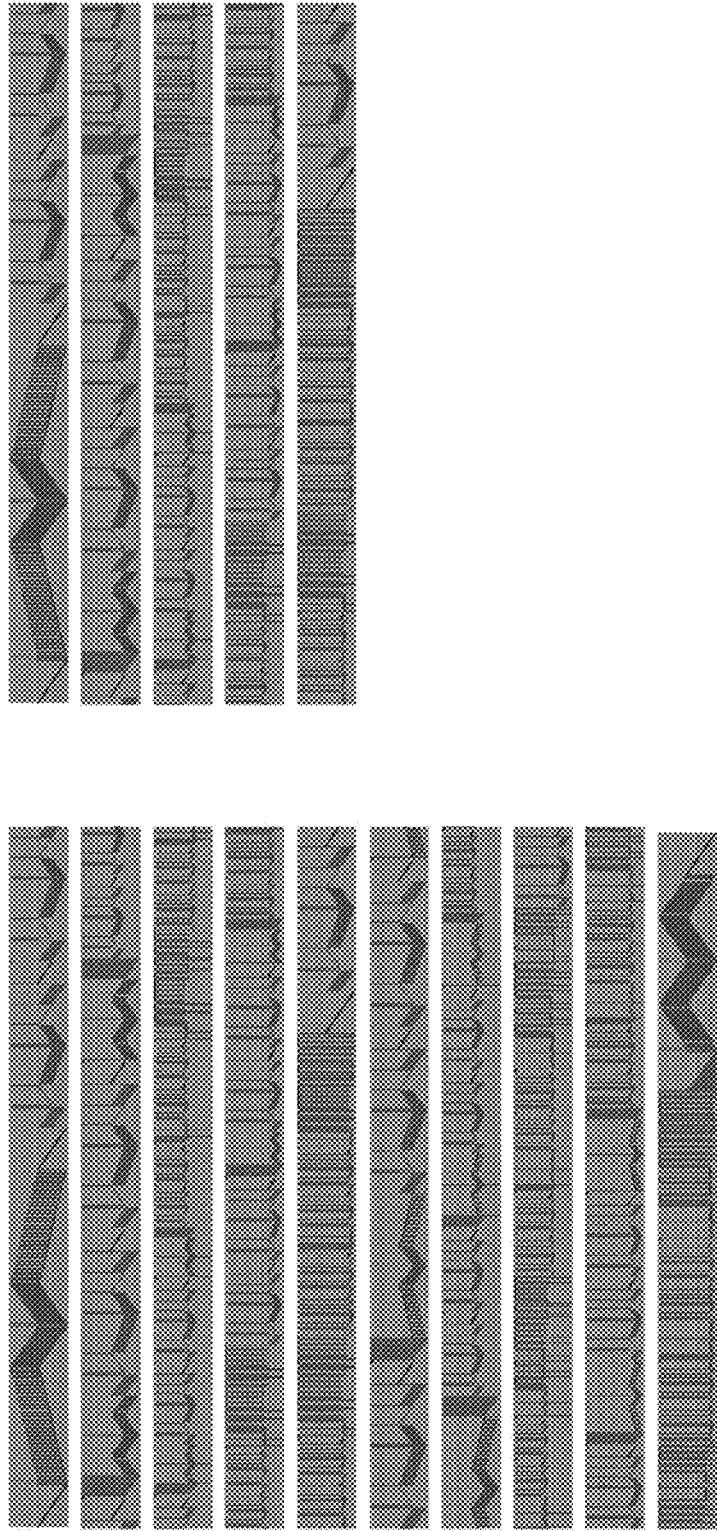
FIG. 19 is a schematic diagram showing an example binary search method for fault-localization for a circuit T that corresponds to an addition by the 16-bit constant 65,521.
Figure 20:
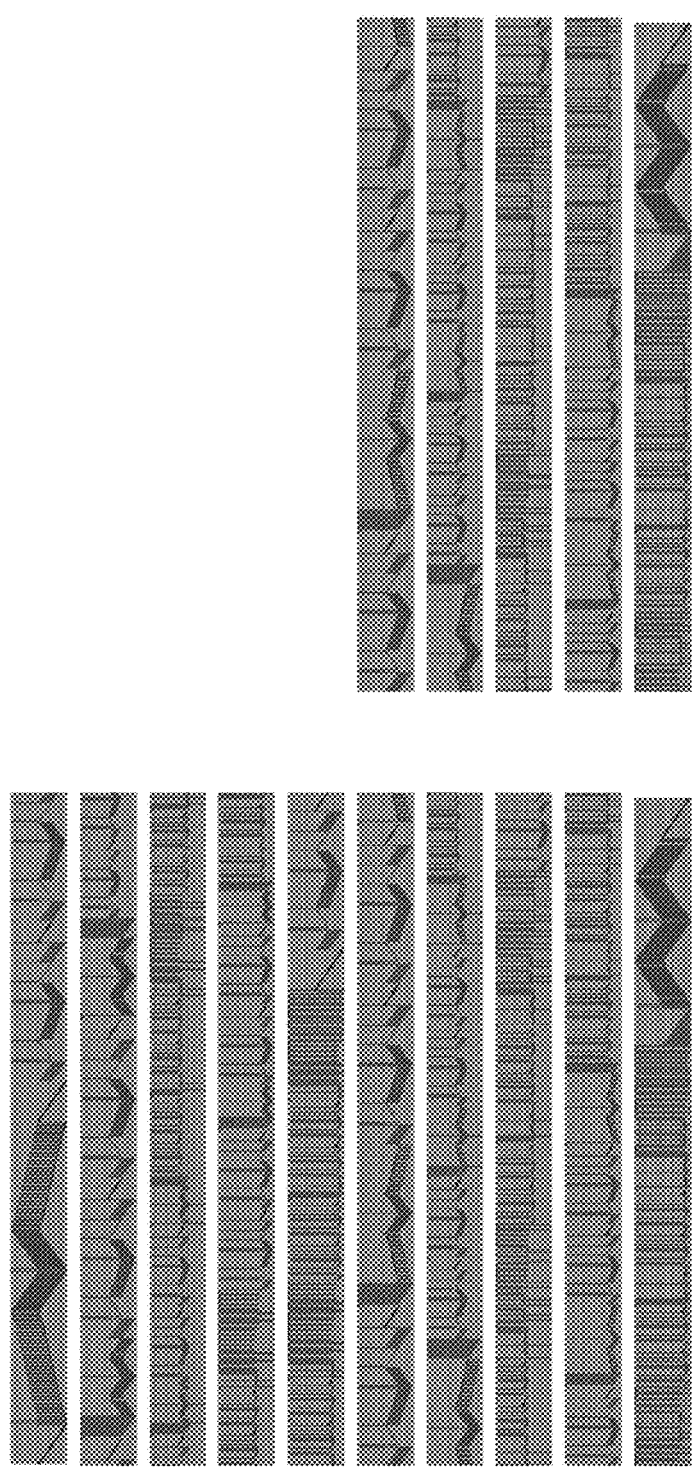
FIG. 20 is a schematic diagram showing an example binary search method for fault-localization for a circuit T that corresponds to an addition by the 16-bit constant 65,521.
Figure 21:
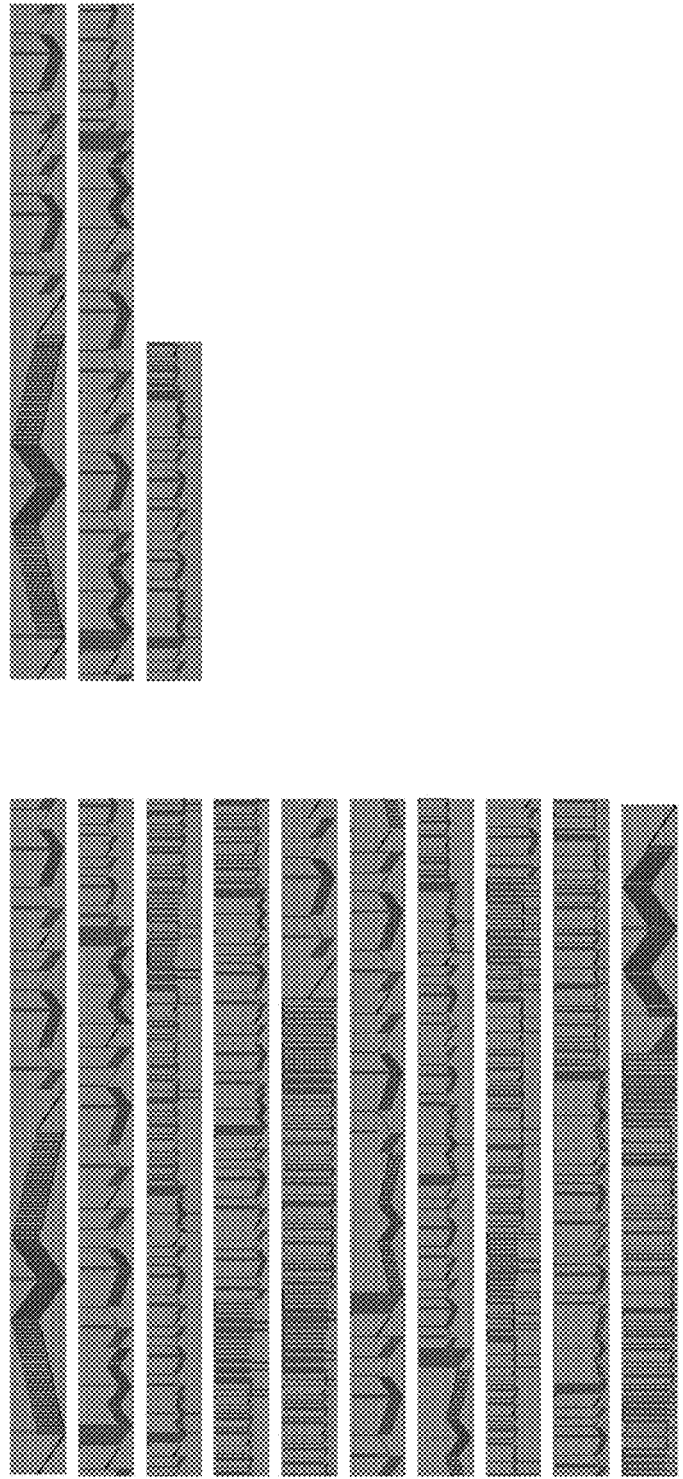
FIG. 21 shows an example test for the subcircuit $T_{00}$ corresponding to the first half of $T_0$.
Figure 22:
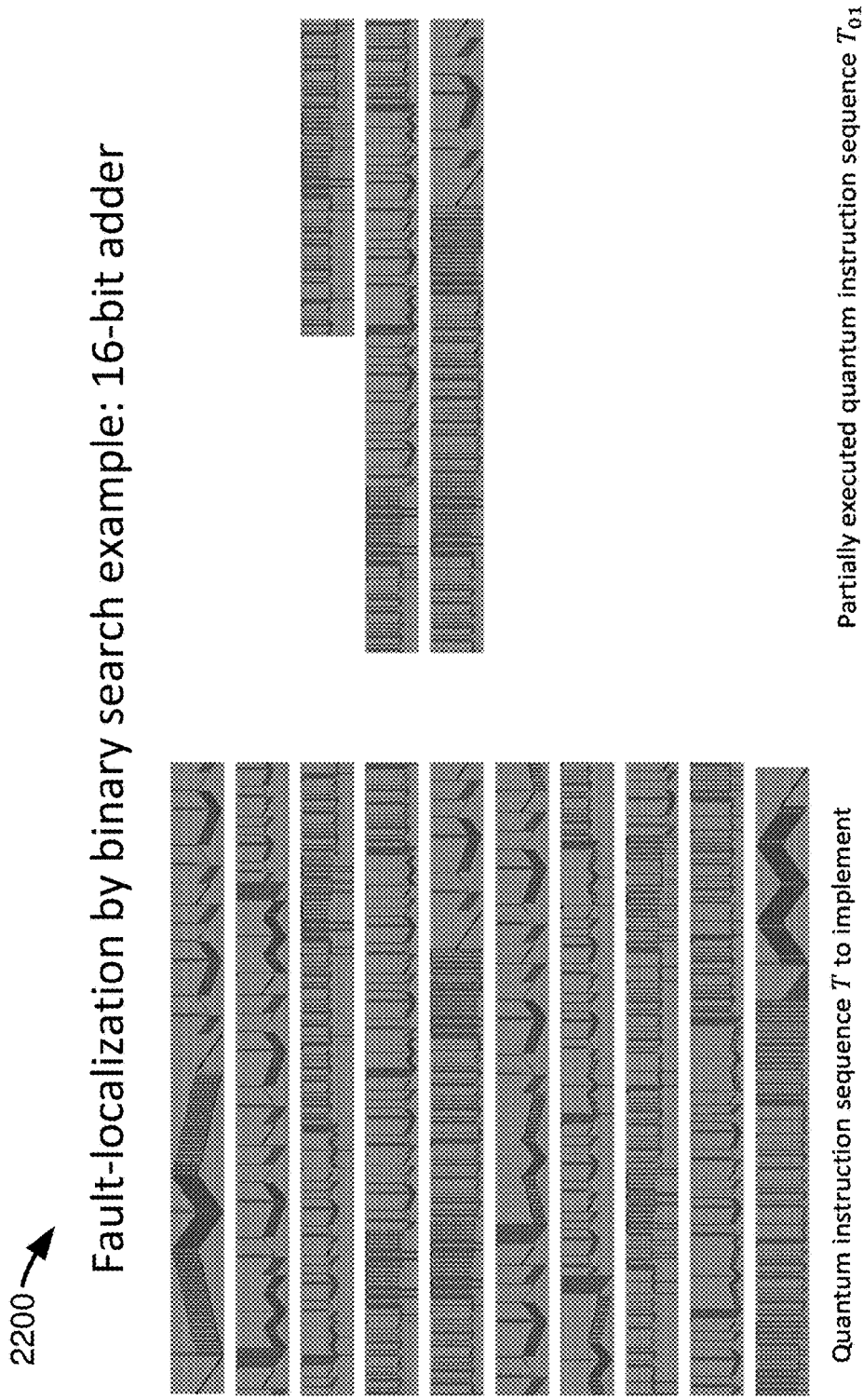
FIG. 22 shows an example test for the subcircuit $T_{01}$ corresponding to the second half of $T_0$.
Figure 23:
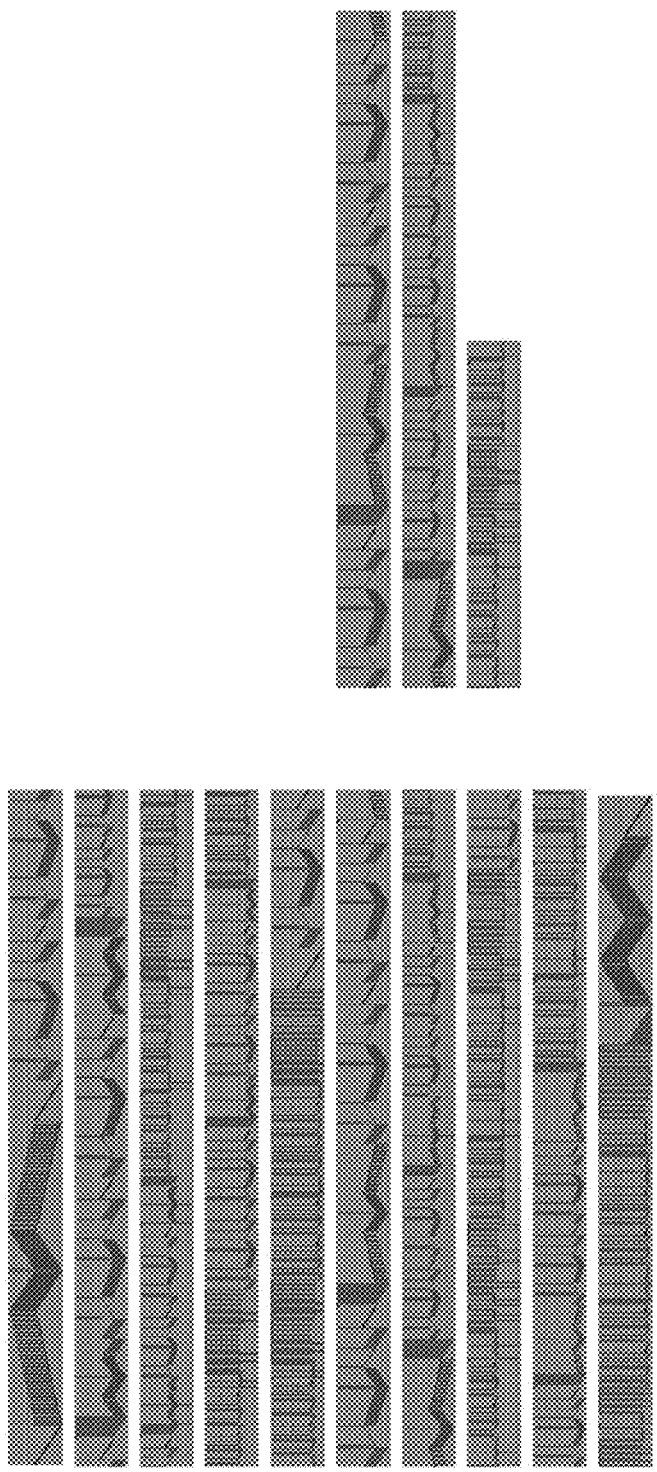
FIG. 23 shows an example test for the subcircuit $T_{10}$ corresponding to the first half of $T_1$.
Figure 24:
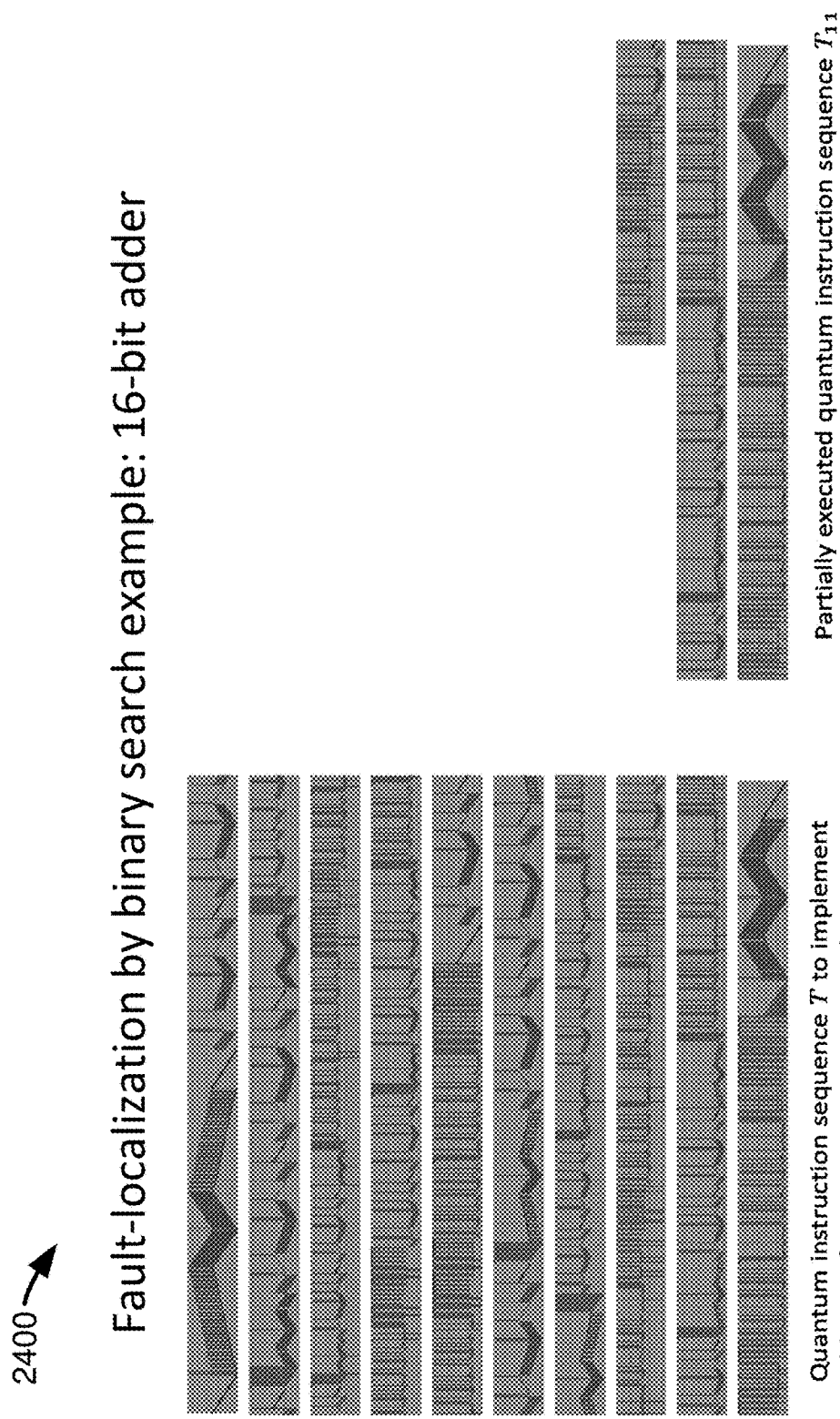
FIG. 24 shows an example test for the subcircuit $T_{11}$ corresponding to the second half of $T_1$.

A plethora of methods are available for the decision on how to split the network T into 2 or more subnetworks. In one embodiment, all elementary instructions in T are grouped together sequentially into one list. This list is then divided into 2 halves, with $T_0$ being the first half and $T_1$ being the second half. The partial sequences $T_0$ and $T_1$ are then executed on the quantum machine and simulated on the classical machine as described above. An example is shown in block diagrams 1900 and 2000 of FIG. 19 and FIG. 20, where the initial network T is a Toffoli network that implements the addition of the constant integer 65,521 to another integer with precision 16 bit. The network is a network obtained from the dirty ancilla construction as in FIG. 4, instantiated for the case of n=16. In the shown figure, the network is wrapped like a musical score into 10 rows, to be read from top to bottom, left to right. The network was generated and rendered using the LIQUi|⟩ quantum compiler system. Toffoli gates structures are visible as darker gray levels in the figure. FIGS. 21, 22, 23 and 24 are block diagrams 2100, 2200, 2300, and 2400 that show further subdivisions of the network obtained by further halving of the previous segments.

In another embodiment, the subdivision of T, as well as the subsequent subdivisions of the resulting subnetworks, can be performed along natural block structures that might exist within T and that arise from functionality. For instance, T might be obtained from a synthesis of various higher level functions, such as adders, multipliers, library calls, etc. If this information is available, it can be used to make the partitions $T_0, T_1, \ldots$ so that $T_0$ corresponds to the first such function, $T_1$ to the second such function etc. As functions might call functions, this might give rise to a recursive partitioning which again can be tested as in FIG. 17.

D. Further Observations

Among the embodiments disclosed herein are Toffoli-based in-place addition circuits which can be used to implement Shor's algorithm using 2n+2 qubits. Particular implementations feature a size in $\mathcal{O}$ ($n^3$ log n), and a depth in $\mathcal{O}$ ($n^3$). In contrast to previous space-efficient implementations (e.g. Stephane Beauregard, "Circuit for Shor's algorithm using 2n+3 qubits," Quantum Information and Computation, 3(2):175-185 (2003); Yasuhiro Takahashi and Noboru Kunihiro, "A quantum circuit for Shor's factoring algorithm using 2n+2 qubits," Quantum Information and Computation, 6(2):184-192 (2006), example embodiments of the modular multiplication circuit disclosed herein comprise only Toffoli and Clifford gates. In addition to facilitating the process of debugging future implementations, having a Toffoli-based circuit also eliminates the need for single-qubit-rotation synthesis when employing quantum error-correction. This results in a better scaling of both size and depth by a factor in $\Theta(\log n)$.

Further, some embodiments employ addition by a constant that can be performed in $\mathcal{O}$ (n log n) operations and that needs $$\frac{n}{2}$$

ancillas, all of which can be dirty, e.g., can be taken from other parts of the computation that are currently idle.

VI. Representative Embodiments

Among the embodiments disclosed herein are methods for performing arithmetic in a quantum computer using one or more qubits in an unknown state comprising any of the techniques disclosed herein. Further embodiments as disclosed herein include quantum circuits comprising any of the quantum devices for performing operations using qubits in an unknown state as shown and described herein (e.g., to perform arithmetic operations as shown and described herein). Particular embodiments comprise an ancilla management system for a quantum computing device configured to allocate ancilla qubits in an unknown state as shown and described herein.

Figure 29:
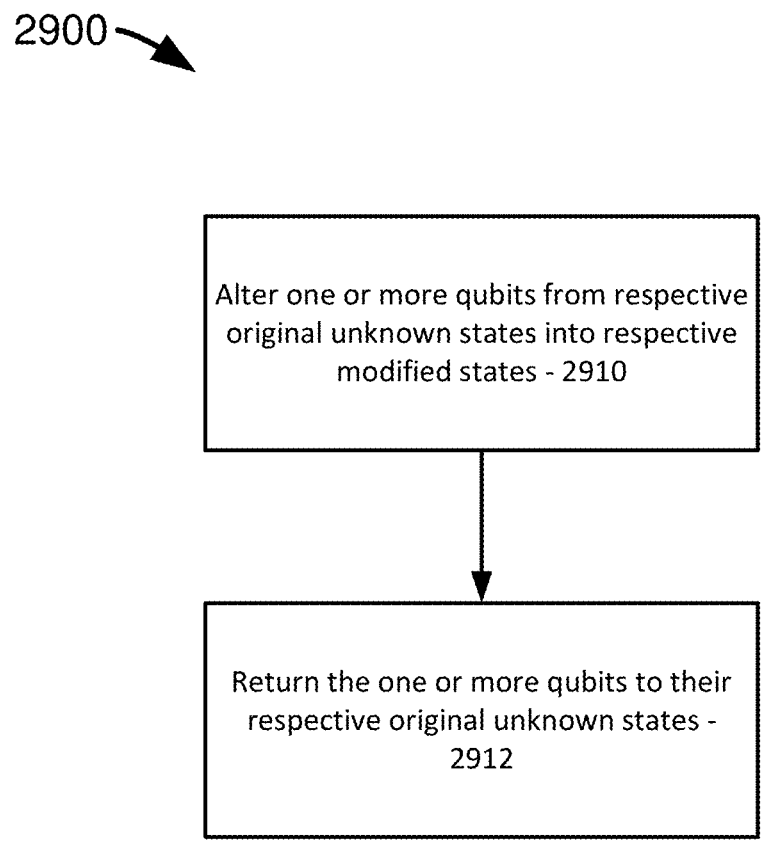
FIG. 29 is a flow chart for an example method of performing aspects of the disclosed technology.

FIG. 29 is a flowchart 2900 illustrating a technique for operating a quantum system in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein. In the illustrated technique, an operation is implemented using one or more qubits in an unknown state.

At 2910, the one or more qubits are altered from respective original unknown states into respective modified states.

At 2912, the one or more qubits are returned from their respective modified states to the to their respective original unknown states.

In particular implementations, as part of the implementing, modular exponentiation is implemented using n modular multiplications, each using one or more qubits from the qubits in the unknown state. Further, as part of the implementing, modular multiplication can be implemented using n modular additions, each using n/2 of the qubits in the unknown state. Still further, as part of the implementing, modular addition of an n-bit numbers by a constant number on a quantum computer can be implemented recursively. In some example, at each level of the recursion, a circuit is used that comprises a subcircuit to compute the most significant bit of a constant addition, a subcircuit to compute the carry of an addition by a constant, and a subcircuit to add the constant number 1. Further, the operation that is performed can be Shor's algorithm.

Another disclosed embodiment is a method comprising implementing an integer incrementer by a constant on a quantum computer using a qubit in an unknown state. In certain implementations, the qubit in the unknown state is the only qubit in an unknown state used in the integer incrementer. In this embodiment, the qubit in the unknown state is altered from an original unknown state to a modified state as part of the implementing the integer incrementer, the qubit in the unknown state is then returned from its modified state to its original unknown state.

Another example embodiment is a method comprising implementing an integer incrementer by a constant on a quantum computer with only one clean qubit.

Still further, another embodiment comprises implementing Shor's algorithm for factoring n-bit numbers in a quantum computing device using one or more qubits in an unknown state. In particular implementations, the quantum computing device uses 2n+2 qubits.

Another disclosed embodiment is a quantum computing device configured to implement a plurality of qubits, the qubits comprising input qubits, output qubits, and scratch qubits, the quantum computing device further comprising a circuit for performing an operation using one or more of the scratch qubits when the scratch qubits are in an unknown state. In some implementations, the operation is an arithmetic operation. Further, in certain examples, the circuit for performing the operation comprises (a) testable Toffoli gates; (b) NOT gates and CNOT gates; (c) or only Toffoli gates. In some examples, the circuit for performing the operation performs the operation without a Fourier transform.

Figure 30:
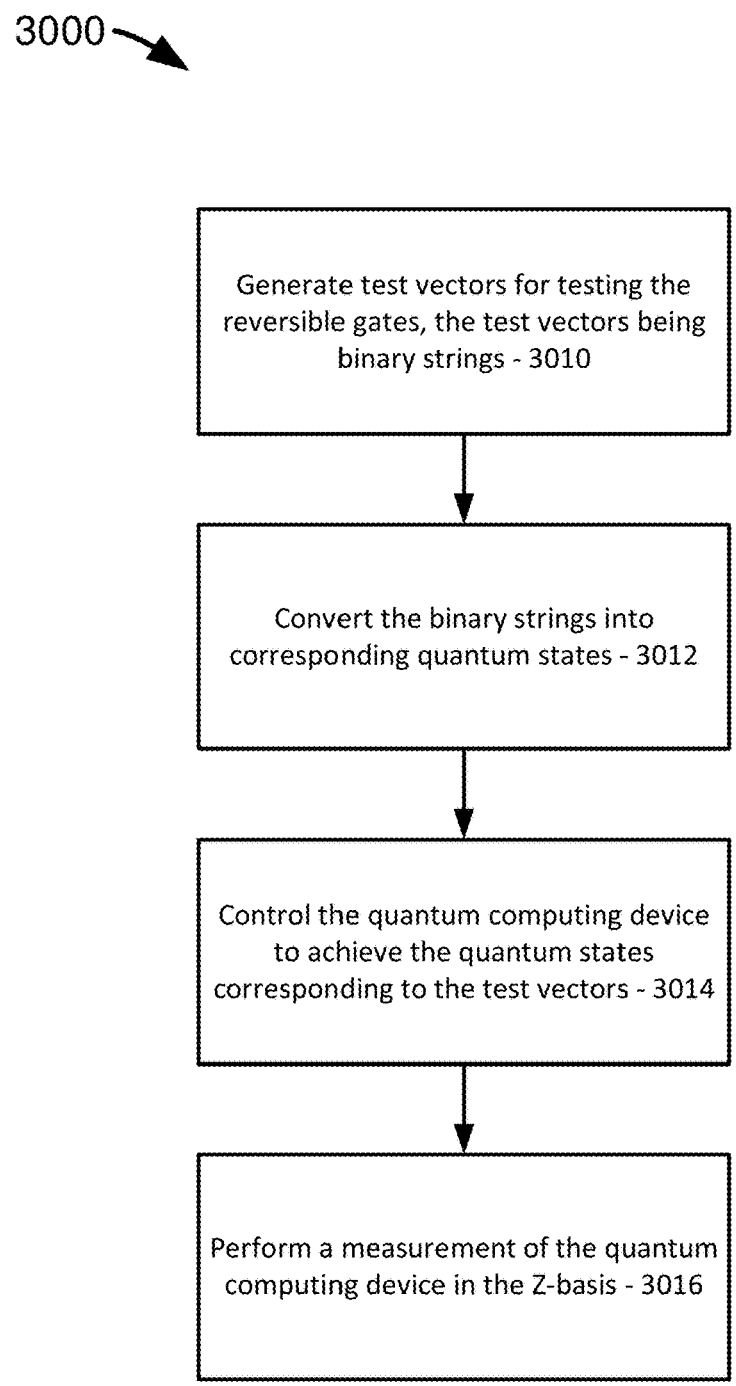
FIG. 30 is a flow chart for another example method of performing aspects of the disclosed technology.

FIG. 30 is a flowchart 3000 illustrating another example technique for operating a quantum system in accordance with embodiments of the disclosed technology. The illustrated example is a method comprising testing reversible gates in a quantum computing device, the reversible gates being arranged to implement an arithmetic operation in the quantum computing device. In some implementations, the reversible gates are Toffoli gates. In further examples, the testing comprises localizing faults in the reversible gates in a quantum computing device using a binary search. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

In FIG. 30, at 3010, test vectors for testing the reversible gates are generated, the test vectors being binary strings.

At 3012, the binary strings are converted into corresponding quantum states.

At 3014, the quantum computing device is controlled to achieve the quantum states corresponding to the test vectors.

At 3016, a measurement of the quantum computing device in the Z-basis is performed.

Yet another embodiment disclosed herein is a computer-implemented quantum circuit compiler programmed to compile a higher level quantum circuit description into a lower level quantum circuit description for controlling a quantum circuit, the quantum circuit compiler comprising an ancilla management system configured to allocate one or more ancilla qubits that are in an unknown state for use in an operation performed in the lower level quantum circuit description. In some examples, the ancilla management system comprises a pointer table that tracks qubits that are in an unknown state and that are not being currently used for the compilation of any other module of the lower level quantum circuit description. In further examples, the compiler is further programmed to specify a sequence of control operations in the lower level quantum circuit description that modifies an allocated qubit in an original unknown state into a respective modified state and then returns the allocated qubit to the original unknown state. In certain examples, the ancilla management system handles both qubits in an unknown state and qubits in a known state. In further examples, the ancilla management system manages the qubits in the unknown states by selectively allocating qubits in unknown states from a heap of qubits in respective original unknown states and returning the allocated qubits to the heap of qubits once the qubits have been returned to their respective original unknown states. Still further, in some examples, the ancilla management system allocates the qubits in the unknown states only if they can be returned to their original unknown state prior to modification by other operations.

VII. Example Computing Environments

Figure 8:
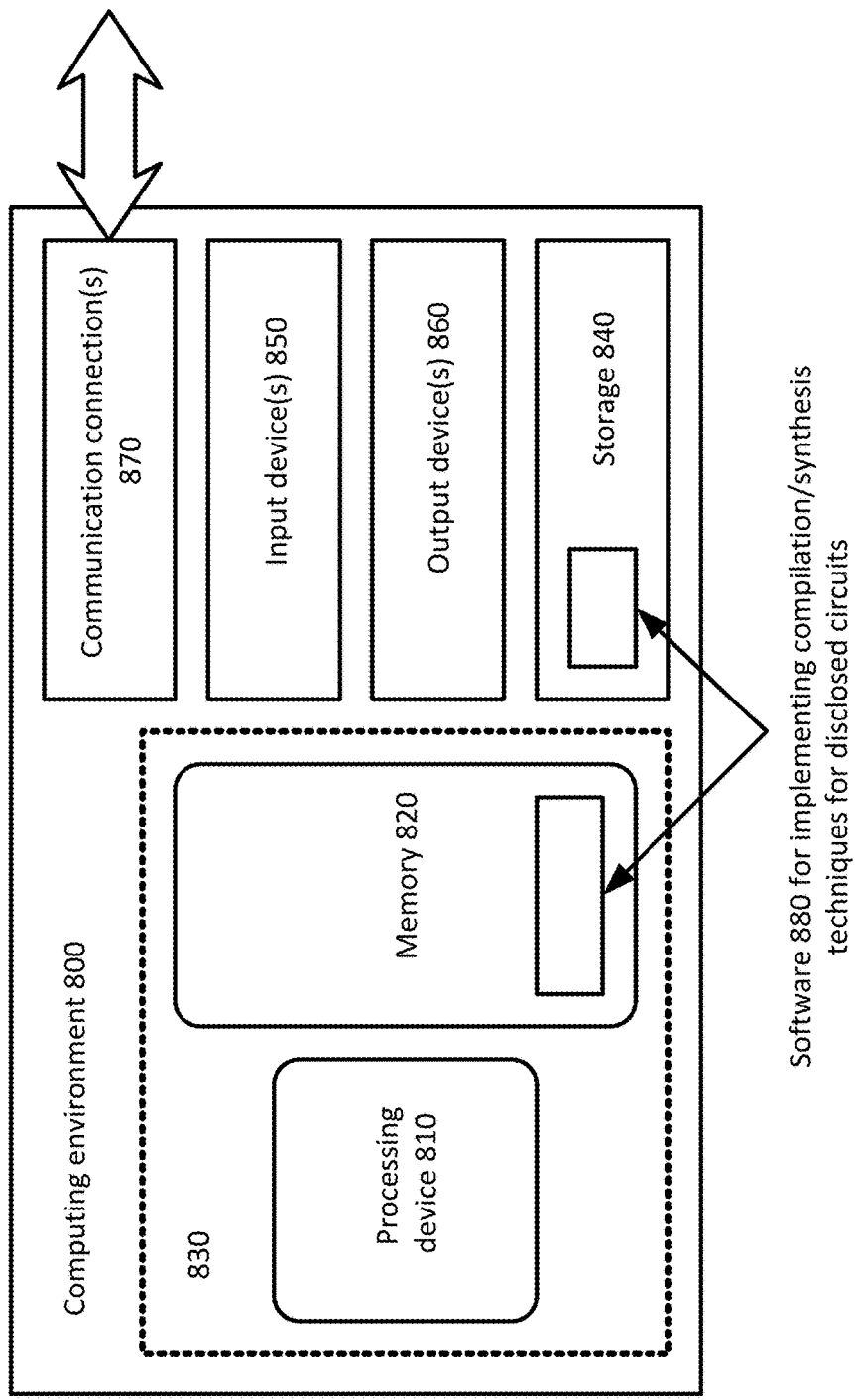
FIG. 8 illustrates a generalized example of a suitable computing environment in which several of the described embodiments can be implemented.

FIG. 8 illustrates a generalized example of a suitable computing environment 800 in which several of the described embodiments can be implemented. The computing environment 800 is not intended to suggest any limitation as to the scope of use or functionality of the disclosed technology, as the techniques and tools described herein can be implemented in diverse general-purpose or special-purpose environments that have computing hardware.

With reference to FIG. 8, the computing environment 800 includes at least one processing device 810 and memory 820. In FIG. 8, this most basic configuration 830 is included within a dashed line. The processing device 810 (e.g., a CPU or microprocessor) executes computer-executable in-structions. In a multi-processing system, multiple processing devices execute computer-executable instructions to increase processing power. The memory 820 may be volatile memory (e.g., registers, cache, RAM, DRAM, SRAM), non-volatile memory (e.g., ROM, EEPROM, flash memory), or some combination of the two. The memory 820 stores software 880 implementing tools for synthesizing or compiling one or more of the circuits described herein and/or performing ancilla management as described herein.

The computing environment can have additional features. For example, the computing environment 800 includes storage 840, one or more input devices 850, one or more output devices 860, and one or more communication connections 870. An interconnection mechanism (not shown), such as a bus, controller, or network, interconnects the components of the computing environment 800. Typically, operating system software (not shown) provides an operating environment for other software executing in the computing environment 800, and coordinates activities of the components of the computing environment 800.

The storage 840 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 800. The storage 840 can also store instructions for the software 880 implementing or synthesizing any of the described techniques, systems, or reversible circuits.

The input device(s) 850 can be a touch input device such as a keyboard, touchscreen, mouse, pen, trackball, a voice input device, a scanning device, or another device that provides input to the computing environment 800. The output device(s) 860 can be a display device (e.g., a computer monitor, laptop display, smartphone display, tablet display, netbook display, or touchscreen), printer, speaker, or another device that provides output from the computing environment 800.

The communication connection(s) 870 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods or compilation/synthesis techniques for generating the disclosed circuits can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 820 and/or storage 840, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 9:
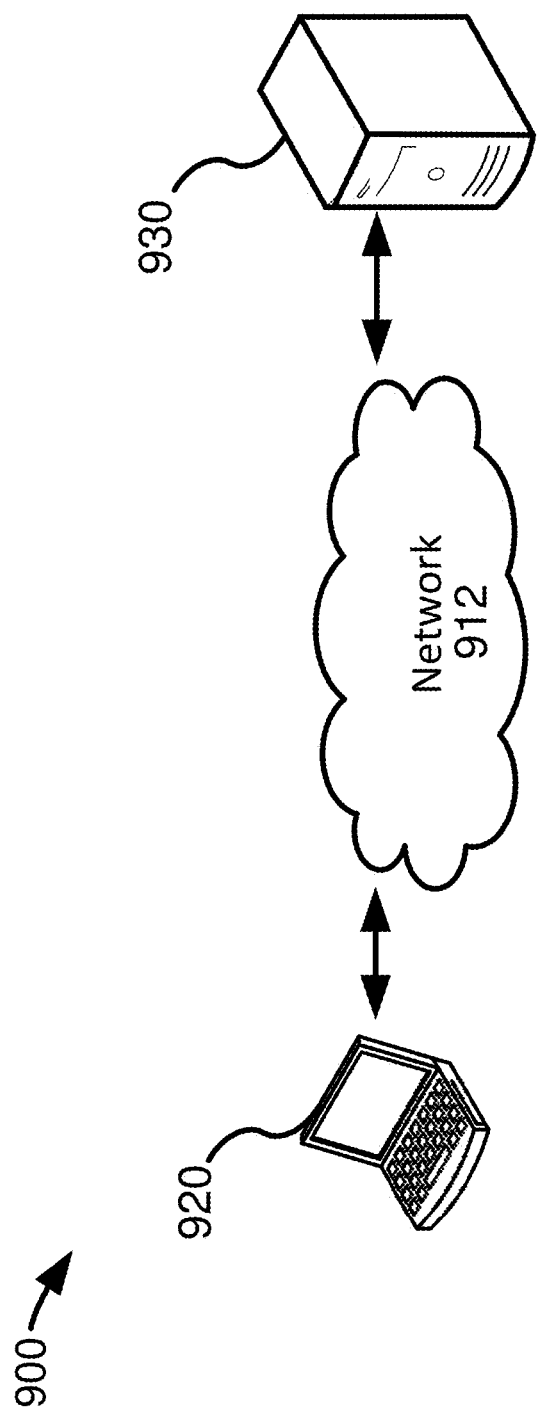
FIGS. 9 and 10 show two example network topologies with which aspects of the disclosed technology can be performed.

An example of a possible network topology 900 (e.g., a client-server network) for implementing a system according to the disclosed technology is depicted in FIG. 9. Networked computing device 920 can be, for example, a computer running a browser or other software connected to a network 912. The computing device 920 can have a computer architecture as shown in FIG. 8 and discussed above. The computing device 920 is not limited to a traditional personal computer but can comprise other computing hardware configured to connect to and communicate with a network 912 (e.g., smart phones, laptop computers, tablet computers, or other mobile computing devices, servers, network devices, dedicated devices, and the like). In the illustrated embodiment, the computing device 920 is configured to communicate with a computing device 930 (e.g., a remote server, such as a server in a cloud computing environment) via a network 912. In the illustrated embodiment, the computing device 920 is configured to transmit input data to the computing device 930, and the computing device 930 is configured to implement compilation/synthesis methods for generating any of the disclosed circuits and outputting results to the computing device 920. Any of the data received from the computing device 930 can be stored or displayed on the computing device 920 (e.g., displayed as data on a graphical user interface or web page at the computing devices 920). In the illustrated embodiment, the illustrated network 912 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 912 can be the Internet or a similar public network and operate using an appropriate protocol (e.g., the HTTP protocol).

Figure 10:
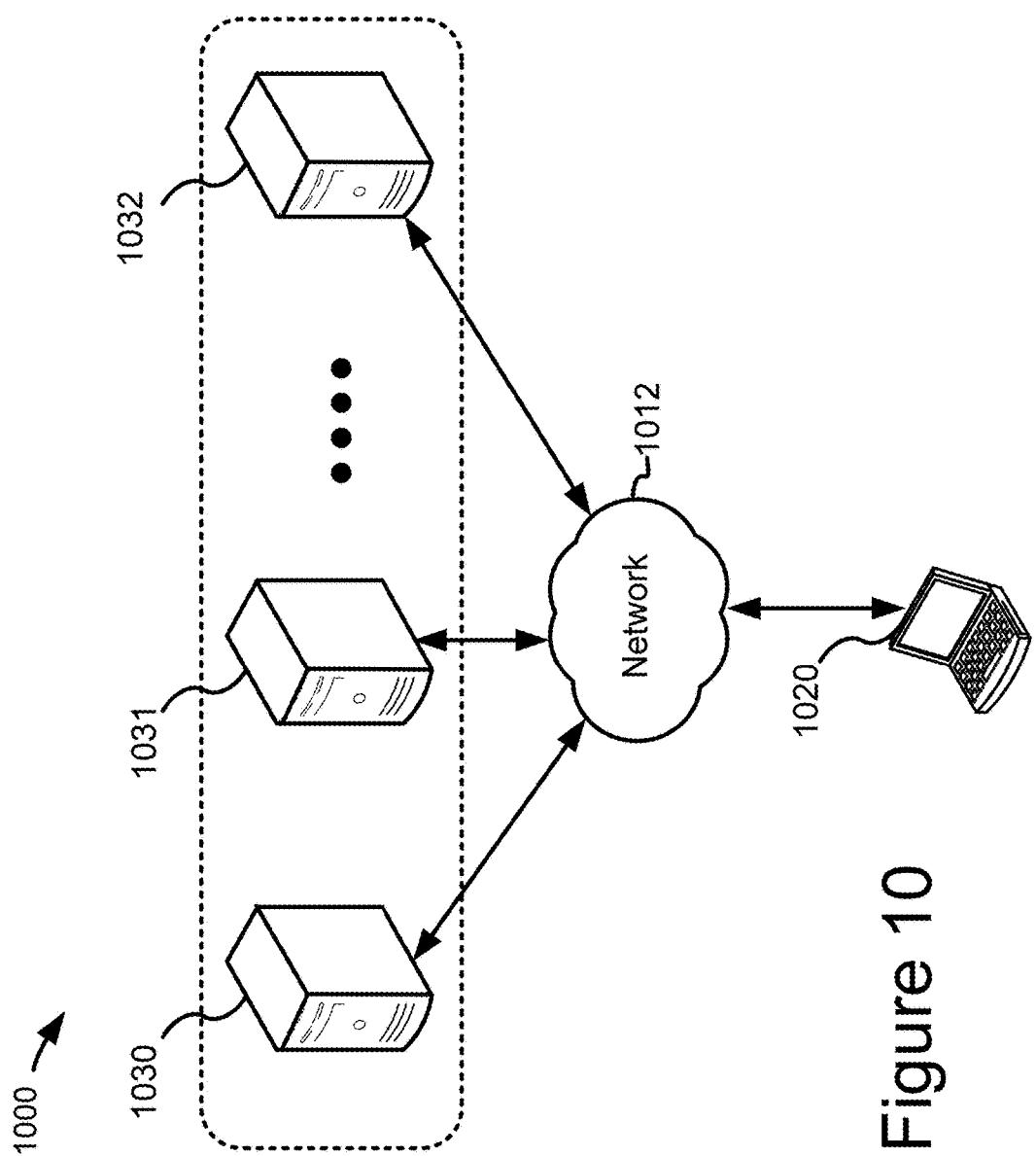

Another example of a possible network topology 1000 (e.g., a distributed computing environment) for implementing a system according to the disclosed technology is depicted in FIG. 10. Networked computing device 1020 can be, for example, a computer running a browser or other software connected to a network 1012. The computing device 1020 can have a computer architecture as shown in FIG. 8 and discussed above. In the illustrated embodiment, the computing device 1020 is configured to communicate with multiple computing devices 1030, 1031, 1032 (e.g., remote servers or other distributed computing devices, such as one or more servers in a cloud computing environment) via the network 1012. In the illustrated embodiment, each of the computing devices 1030, 1031, 1032 in the computing environment 1000 is used to perform at least a portion of the compilation and/or ancilla management process. In other words, the computing devices 1030, 1031, 1032 form a distributed computing environment in which the compilation/ancilla management process is shared across multiple computing devices. The computing device 1020 is configured to transmit input data to the computing devices 1030, 1031, 1032, which are configured to distributively implement a compilation/ancilla management process, including performance of any of the disclosed methods, and to provide results to the computing device 1020. Any of the data received from the computing devices 1030, 1031, 1032 can be stored or displayed on the computing device 1020 (e.g., displayed as data on a graphical user interface or web page at the computing devices 1020). The illustrated network 1012 can be any of the networks discussed above with respect to FIG. 9.

With reference to FIG. 11, an exemplary system for implementing the disclosed technology includes computing environment 1100. In computing environment 1100, a compiled quantum computer circuit description including any of the disclosed quantum circuits in accordance with any of the disclosed embodiments can be used to program (or configure) one or more quantum processing units such that the quantum processing unit(s) implement the circuit described by the quantum computer circuit description. The quantum computer circuit description can implement any of the disclosed circuits, including the sequence for controlling the circuit to perform its desired operation, use "dirty" and "clean" ancillas as part of circuit operation, increment the example incrementer circuits described, and reverse the applied sequences as described.

The environment 1100 includes one or more quantum processing units 1102 and one or more readout device(s) 1108. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 1106 at the control of quantum processor controller 1120. The quantum processor controller (QP controller) 1120 can operate in conjunction with a classical processor 1110 (e.g., having an architecture as described above with respect to FIG. 8) to implement the desired quantum computing process. In the illustrated example, the QP controller 1120 further implements the desired quantum computing process via one or more QP subcontrollers 1104 that are specially adapted to control a corresponding one of the quantum processor(s) 1102. For instance, in one example, the quantum controller 1120 facilitates implementation of the compiled quantum circuit by sending instructions to one or more memories (e.g., lower-temperature memories), which then pass the instructions to low-temperature control unit(s) (e.g., QP subcontroller(s) 1104) that transmit, for instance, pulse sequences representing the gates to the quantum processing unit(s) 1102 for implementation. In other examples, the QP controller(s) 1120 and QP subcontroller(s) 1104 operate to provide appropriate magnetic fields, encoded operations, or other such control signals to the quantum processor(s) to implement the operations of the compiled quantum computer circuit description. The quantum controller(s) can further interact with readout devices 1108 to help control and implement the desired quantum computing process (e.g., by reading or measuring out data results from the quantum processing units once available, etc.)

With reference to FIG. 11, compilation is the process of translating a high-level description of a quantum algorithm into a quantum computer circuit description comprising a sequence of quantum operations or gates, which can include the circuits as disclosed herein. The compilation can be performed by a compiler 1122 using a classical processor 1110 (e.g., as shown in FIG. 8) of the environment 1100 which loads the high-level description from memory or storage devices 1112 and stores the resulting quantum computer circuit description in the memory or storage devices 1112.

In other embodiments, compilation and/or verification can be performed remotely by a remote computer 1100 (e.g., a computer having a computing environment as described above with respect to FIG. 800) which stores the resulting quantum computer circuit description in one or more memory or storage devices 1162 and transmits the quantum computer circuit description to the computing environment 1100 for implementation in the quantum processing unit(s) 1102. Still further, the remote computer 1100 can store the high-level description in the memory or storage devices 1162 and transmit the high-level description to the computing environment 1100 for compilation and use with the quantum processor(s). In any of these scenarios, results from the computation performed by the quantum processor(s) can be communicated to the remote computer after and/or during the computation process. Still further, the remote computer can communicate with the QP controller(s) 1120 such that the quantum computing process (including any compilation, verification, and QP processor control procedures) can be remotely controlled by the remote computer 1160. In general, the remote computer 1160 communicates with the QP controller(s) 1120, compiler/synthesizer 1122, and/or verification tool 1123 via communication connections 1150.

In particular embodiments, the environment 1100 can be a cloud computing environment, which provides the quantum processing resources of the environment 1100 to one or more remote computers (such as remote computer 1460) over a suitable network (which can include the internet).

VIII. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. A method comprising implementing an integer incrementer on a quantum computer using a qubit in an unknown state, wherein the implementing comprises:
    altering the qubit in the unknown state from an original unknown state to a modified state as part of the implementing the integer incrementer; and
    returning the qubit in the unknown state from its modified state to its original unknown state.

2. The method of claim 1, wherein the qubit in the unknown state is the only qubit in an unknown state used in the integer incrementer with only 1 dirty qubit.

3. A method, comprising:
    implementing an operation in a quantum computing device using one or more qubits in an unknown state, wherein the implementing comprises:
        altering the one or more qubits from respective original unknown states into respective modified states; and
        returning the one or more qubits from their respective modified states to the to their respective original unknown states.

4. The method of claim 3, wherein, as part of the implementing, modular exponentiation is implemented using n modular multiplications, each using one or more qubits from the dirty qubits in the unknown state.

5. The method of claim 3, wherein, as part of the implementing, modular multiplication is implemented using n modular additions, each using n/2 of the dirty qubits in the unknown state.

6. The method of claim 3, wherein, as part of the implementing, modular addition of an n-bit numbers by a constant number on a quantum computer is implemented recursively.

7. The method of claim 6, wherein, at each level of the recursion, a circuit is used that comprises a subcircuit to compute the most significant bit of a constant addition, a subcircuit to compute the carry of an addition by a constant, and a subcircuit to add the constant number 1.

8. The method of claim 3, wherein the operation is Shor's algorithm.

9. A quantum computing device comprising input qubits, output qubits, and scratch qubits,
    the quantum computing device further comprising a circuit for performing an arithmetic operation using one or more of the scratch qubits when the scratch qubits are in an unknown state by altering at least one of the scratch qubits in the unknown state from an original unknown state to a modified state, and returning the at least one of the scratch qubits in the unknown state from its modified state to the original unknown state.

10. The quantum computing device of claim 9, wherein the circuit for performing the arithmetic operation comprises testable Toffoli gates.

11. The quantum computing device of claim 9, wherein the circuit for performing the operation comprises NOT gates and CNOT gates.

12. The quantum computing device of claim 9, wherein the circuit for performing the arithmetic operation comprises only Toffoli gates.

13. The quantum computing device of claim 9, wherein the circuit for performing the arithmetic operation performs the arithmetic operation without a Fourier transform.

14. An ancilla management system for a quantum computer configured to allocate one or more ancilla qubits in an unknown state for use in a first operation that modifies the qubits in the unknown states into respective modified unknown states and, in a second operation, returns the qubits to their original unknown states, wherein the ancilla management system allocates the qubits in the unknown states only if the qubits in the unknown state can be returned to their original unknown state prior to modification by other operations.

15. The ancilla management system of claim 14, wherein the ancilla management system manages the ancilla qubits in the unknown states by selectively allocating qubits from a heap of qubits in respective unknown states and returning the allocated qubits to the heap once the qubits have been returned to their respective unknown states.

* * * * *